US011101617B2

(12) United States Patent
Meade

(10) Patent No.: US 11,101,617 B2
(45) Date of Patent: Aug. 24, 2021

(54) WAFER-LEVEL HANDLE REPLACEMENT

(71) Applicant: Ayar Labs, Inc., Emeryville, CA (US)

(72) Inventor: Roy Edward Meade, Oakland, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 16/513,661

(22) Filed: Jul. 16, 2019

(65) Prior Publication Data

US 2020/0021079 A1 Jan. 16, 2020

Related U.S. Application Data

(60) Provisional application No. 62/698,860, filed on Jul. 16, 2018.

(51) Int. Cl.
*H01L 25/075* (2006.01)
*H01S 5/02* (2006.01)
*F21V 8/00* (2006.01)
*G02B 6/43* (2006.01)
G02B 6/124 (2006.01)
G02B 6/30 (2006.01)
G02B 6/136 (2006.01)
G02B 6/12 (2006.01)

(52) U.S. Cl.
CPC ............... *H01S 5/02* (2013.01); *G02B 6/0006* (2013.01); *G02B 6/43* (2013.01); *H01L 25/075* (2013.01); *G02B 6/124* (2013.01); *G02B 6/12004* (2013.01); *G02B 6/136* (2013.01); *G02B 6/30* (2013.01)

(58) Field of Classification Search
CPC .......... H01S 5/02; H01L 25/075; G02B 6/43; G02B 6/0006; G02B 6/124; G02B 6/30; G02B 6/136; G02B 6/12004
USPC .......................................................... 438/34
See application file for complete search history.

(56) References Cited

U.S. PATENT DOCUMENTS

| 4,374,915 A | 2/1983 | Ahlquist et al. |
| 4,767,724 A | 8/1988 | Kim et al. |
| 6,555,441 B2 | 4/2003 | Ouellet |

(Continued)

OTHER PUBLICATIONS

Chen Sun et al., "Single-Chip Microprocessor that Communicates Directly Using Light," Nature, 2015.

(Continued)

*Primary Examiner* — Vu A Vu
(74) *Attorney, Agent, or Firm* — Penilla IP, APC

(57) ABSTRACT

A wafer includes a number of die, with each die including electronic integrated circuits and optical devices. The wafer has a top surface and a bottom surface and a base layer. The bottom surface of the wafer corresponds to a bottom surface of the base layer. A wafer support system is attached to the top surface of the wafer. A thickness of the base layer is removed to expose a target layer within the wafer and to give the wafer a new bottom surface. A replacement handle structure is attached to the new bottom surface of the wafer. The replacement handle structure includes a first thickness region and a second thickness region. The first thickness region is positioned closest to the new bottom surface. The first thickness region is formed of an optical cladding material that mitigates optical coupling between optical devices within the die and the replacement handle structure.

38 Claims, 28 Drawing Sheets

(56) References Cited

U.S. PATENT DOCUMENTS

| | | |
|---|---|---|
| 6,902,986 B2 | 6/2005 | Maltabes et al. |
| 7,454,102 B2 | 11/2008 | Keyser et al. |
| 7,823,216 B2 | 10/2010 | Fan et al. |
| 7,920,770 B2 | 4/2011 | Holzwarth et al. |
| 2001/0012593 A1 | 8/2001 | Chang et al. |
| 2004/0004217 A1* | 1/2004 | Jayaraman ............... H01S 5/12 257/53 |
| 2004/0142256 A1 | 7/2004 | Best et al. |
| 2004/0266202 A1 | 12/2004 | Bandy et al. |
| 2005/0284181 A1 | 12/2005 | Smith et al. |
| 2006/0226118 A1 | 10/2006 | Baluswamy et al. |
| 2007/0253663 A1 | 11/2007 | Keyser et al. |
| 2009/0274418 A1 | 11/2009 | Holzwarth et al. |
| 2013/0210214 A1* | 8/2013 | Dallesasse .......... H01L 21/8258 438/458 |
| 2014/0368804 A1 | 12/2014 | Lafarre et al. |
| 2018/0019139 A1 | 1/2018 | Sun et al. |
| 2020/0058541 A1* | 2/2020 | Konishi ............ H01L 21/76251 |

OTHER PUBLICATIONS

C. Holzwarth et al., "Localized Substrate Removal Technique Enabling Strong-Confinement Microphotonics in Bulk Si CMOS Processes," Conference on Lasers and Elctro-Optics, Optical Society of America, 2008.

J. Orcutt et al., "Nanophotonic Integration in State-of-the-Art CMOS Foundries," Optics Express 19.3 (2011): 2335-2346.

G. Li et al., "Ultralow-Power High-Performance Si Photonic Transmitter," Optical Fiber Communication Conference, Optical Society of America, 2010.

Klaus Reimer et al, "Micro-Optic Fabrication Using One-Level Gray-Tone Lithography," Proc. SPIE vol. 3008, p. 279-288: Miniaturized Systems with Microoptics and Micromechanics II, San Jose, 1997.

* cited by examiner (View A-A)

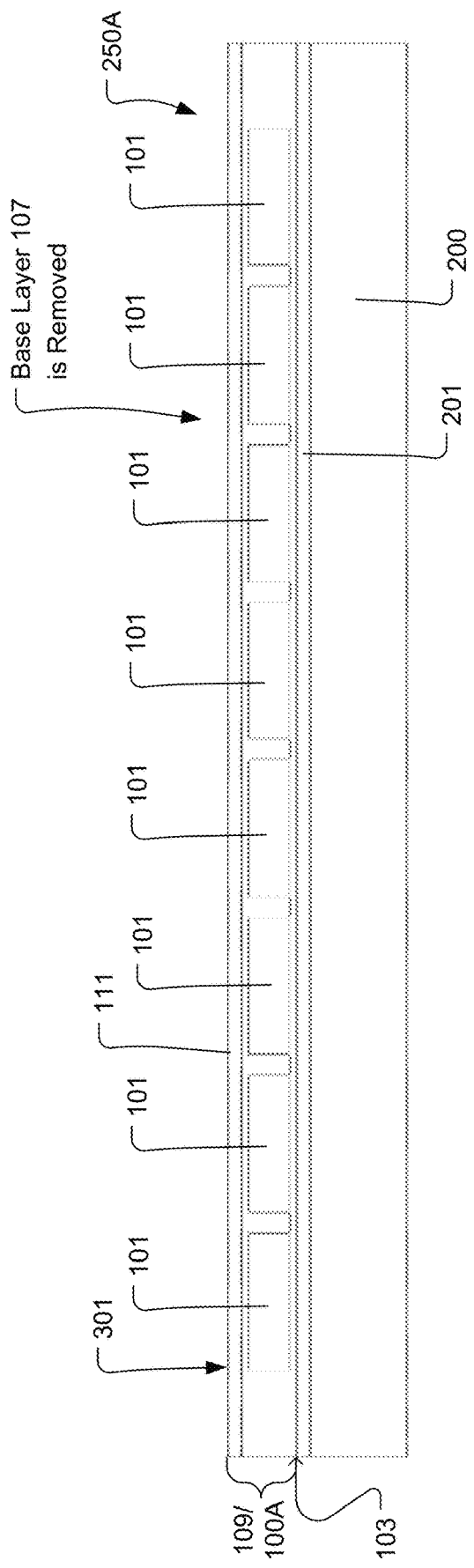

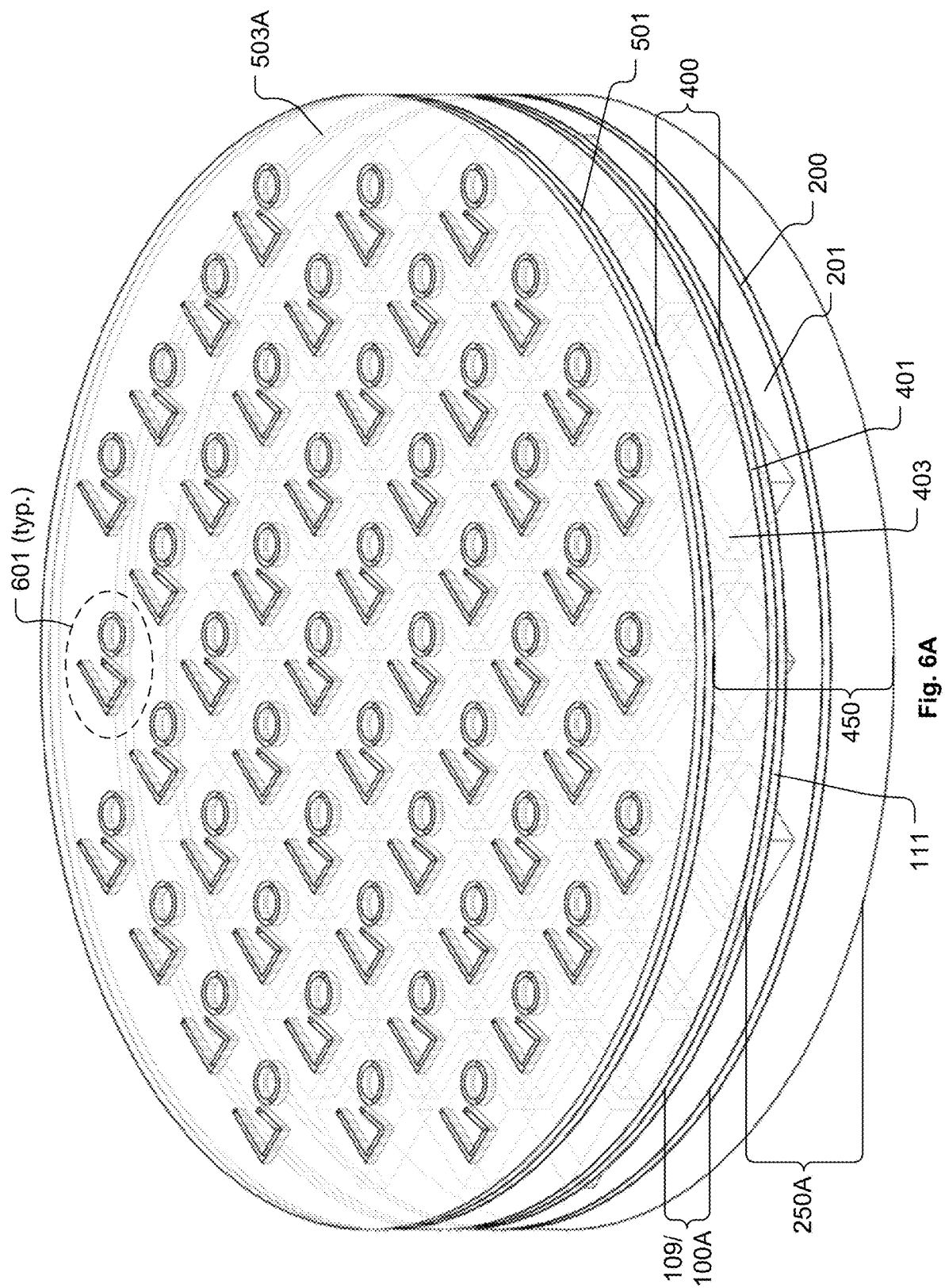

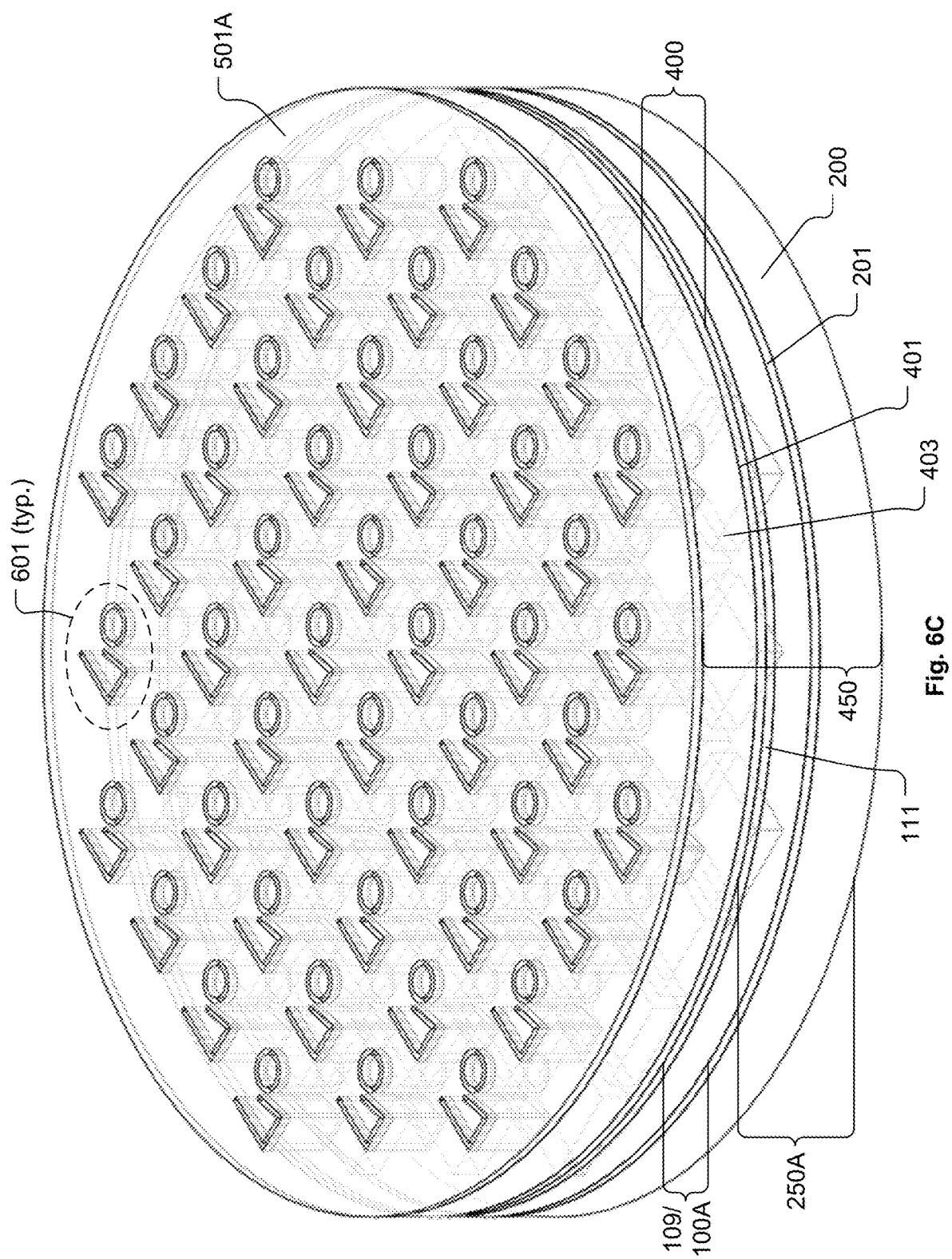

WAFER-LEVEL HANDLE REPLACEMENT

CLAIM OF PRIORITY

This application claims priority under 35 U.S.C. 119(e) to U.S. Provisional Patent Application No. 62/698,860, filed Jul. 16, 2018, the disclosure of which is incorporated herein by reference in its entirety for all purposes.

GOVERNMENT LICENSE RIGHTS

This invention was made with government support under contract number DE-AR0000850 awarded by the U.S. Department of Energy (DOE), Office of ARPA-E. The government has certain rights in this invention.

BACKGROUND

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient mechanisms for transmitting laser light and detecting laser light at different nodes within the optical data network. In this regard, it can be necessary to transmit laser light from an optical fiber to a chip, and vice-versa. It is within this context that the present invention arises.

SUMMARY

In an example embodiment, a method is disclosed for wafer-level handle replacement. The method includes having a wafer that includes a number of die. Each die includes electronic integrated circuits and optical devices. The wafer has a top surface and a bottom surface. The wafer has a base layer. The bottom surface of the wafer corresponds to a bottom surface of the base layer. The method includes attaching a wafer support system to the top surface of the wafer. The method also includes removing a thickness of the base layer from the wafer to expose a target layer within the wafer. The wafer has a new bottom surface after removing the thickness of the base layer. The method also includes attaching a replacement handle structure to the new bottom surface of the wafer. The replacement handle structure includes a first thickness region and a second thickness region. The first thickness region is positioned closest to the new bottom surface of the wafer relative to the second thickness region. The first thickness region is formed of an optical cladding material that mitigates optical coupling between optical devices within the die and the replacement handle structure. The method can also include depositing a hard mask material on the replacement handle structure. The method can also include depositing a photoresist material on the hard mask material. The method can also include patterning the photoresist material to form openings in the photoresist material that expose portions of the hard mask material. The method can also include etching the hard mask material through the openings in the photoresist material to form corresponding openings in the hard mask material that expose portions of the replacement handle structure through the openings in the hard mask material. The method can also include removing the photoresist material. The method can also include etching the replacement handle structure through the openings in the hard mask material to form corresponding cavities in the replacement handle structure. The cavities are positioned over the die in the wafer to enable optical connection of optical devices within the die to respective optical devices external to the die.

In an example embodiment, an electro-optic chip assembly is disclosed. The electro-optic chip assembly includes a die having a top surface and a bottom surface. The top surface of the die has a number of exposed electrical contacts. The bottom surface of the die corresponds to a target layer within an original wafer in which the die was formed. The target layer is exposed by removal of a portion of the original wafer. The die includes electronic integrated circuits and optical devices. The electro-optic chip assembly also includes a replacement handle structure attached to the bottom surface of the die. The replacement handle structure includes a first thickness region and a second thickness region. The first thickness region is positioned closest to the die relative to the second thickness region. The first thickness region is formed of an optical cladding material that mitigates optical coupling between optical devices within the die and the replacement handle structure. The electro-optic chip assembly also includes a hard mask material disposed on the replacement handle structure. The electro-optic chip assembly also includes a number of cavities formed through the hard mask material and the replacement handle structure to a specified level. The cavities are positioned over the die to enable optical connection of optical devices within the die to respective optical devices external to the die.

BRIEF DESCRIPTION OF THE DRAWINGS

FIG. 3A shows an inverted side view of a modified composite wafer assembly corresponding to the composite wafer assembly after removal of the base layer of silicon from the bottom of the wafer, in accordance with some embodiments.

FIG. 6A shows an isometric view of the handle-integrated composite wafer assembly having the hardmask material and the photoresist material deposited thereon, with the photoresist material patterned and developed to expose portions of the underlying hardmask material, in accordance with some embodiments.

FIG. 6C shows an isometric view of the handle-integrated composite wafer assembly having the patterned hardmask material thereon, in accordance with some embodiments.

DETAILED DESCRIPTION

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
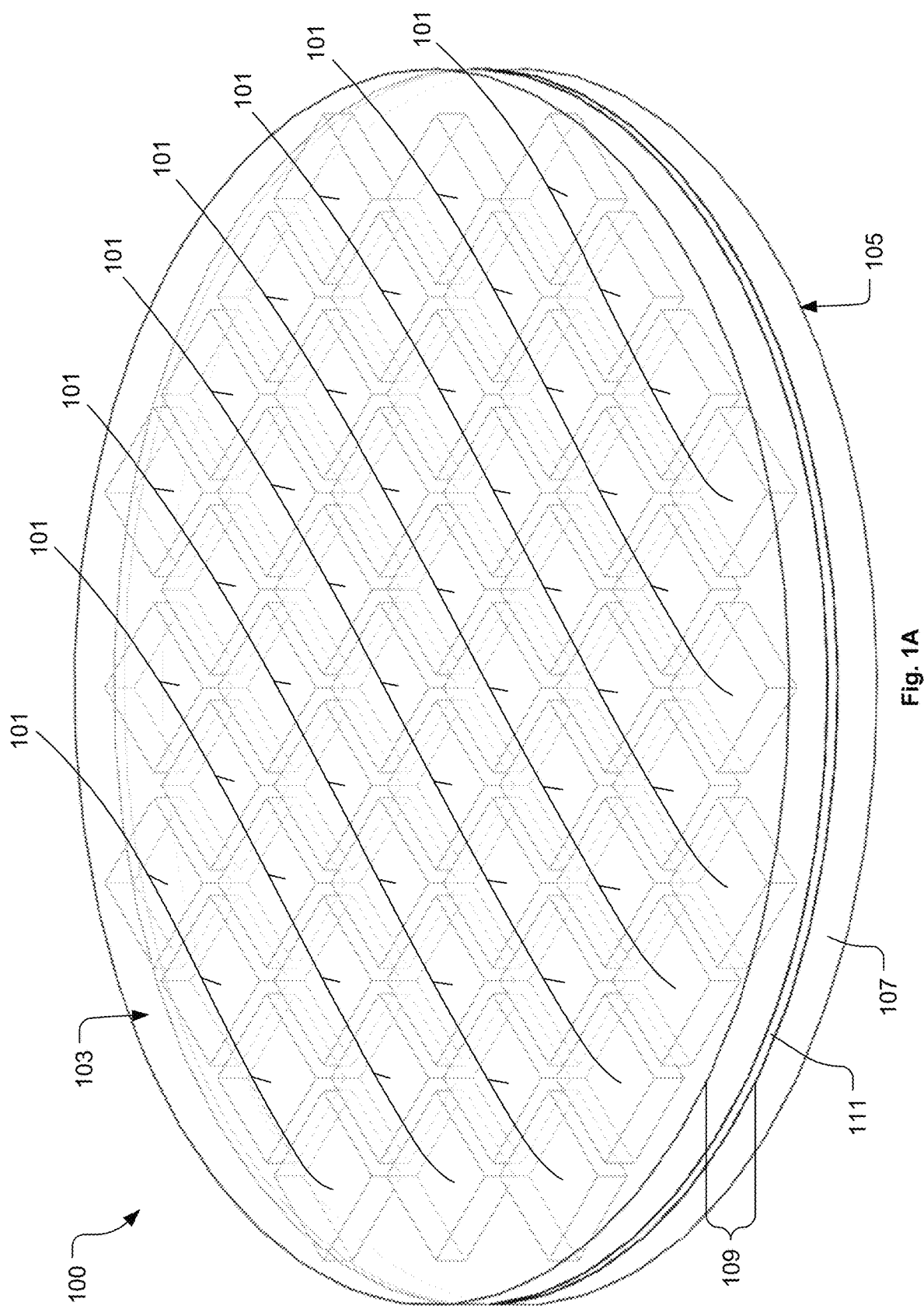
FIG. 1A shows a wafer that includes a number of die, in accordance with some embodiments.

FIG. 1A shows a wafer 100 that includes a number of die 101, in accordance with some embodiments. Each die 101 includes electronic integrated circuits and optical (photonic) devices. The wafer 100 has a top surface 103 and a bottom surface 105. The wafer has a base layer 107 that extends into the wafer 100 from the bottom surface 105. The bottom surface 105 of the wafer corresponds to the bottom surface of the base layer 107. The wafer also includes a front region 109 that extends into the wafer 100 from the top surface 103. The front region 109 includes the die 101 which are formed to include interlevel dielectric (silicon dioxide, silicon nitride, and/or permutations of silicon dioxide such as SiCOH, etc.), electrical interconnect (e.g., back end of line aluminum, tungsten, and/or copper wires), and semiconductor devices (e.g., silicon body plus Buried Oxide (BOX) for a Silicon-on-Insulator (SOI) wafer, and/or bulk Complementary Metal-Oxide Semiconductor (CMOS) down to Shallow Trench Isolation (STI) for a bulk CMOS wafer). In some embodiments, the wafer 100 is a SOI wafer, and a lower portion 111 of the front region 109 includes a Buried Oxide (BOX) region 111. In some embodiments, the wafer 100 is a CMOS wafer, and the lower portion 111 of the front region 109 includes a Shallow Trench Isolation (STI) region. In some embodiments, the base layer 107 of the wafer 100 is formed of silicon. In some embodiments, the wafer 100 is a SOI wafer, and the base layer 107 is the handle silicon located below the BOX material in the lower portion 111 of the front region 109. In some embodiments, the wafer 100 is a CMOS wafer, and the base layer 107 is the silicon located below the STI structures within the lower portion 111 of the front region 109.

It should be understood that the number and arrangement of die 101 on the wafer 100 is provided by way of example of ease of description. In various embodiments, the number and arrangement of die 101 on the wafer 100 can differ from what is shown in the example of FIG. 1A. Also, it should be understood that the various structures and components depicted in FIG. 1A are not drawn to scale, but rather are sized to facilitate description. Also, in some embodiments, fabrication of the die 101 on the wafer 100 has been completed. In other words, the wafer 100 exists in a state after fabrication of the die 101 is completed.

Figure 1B:
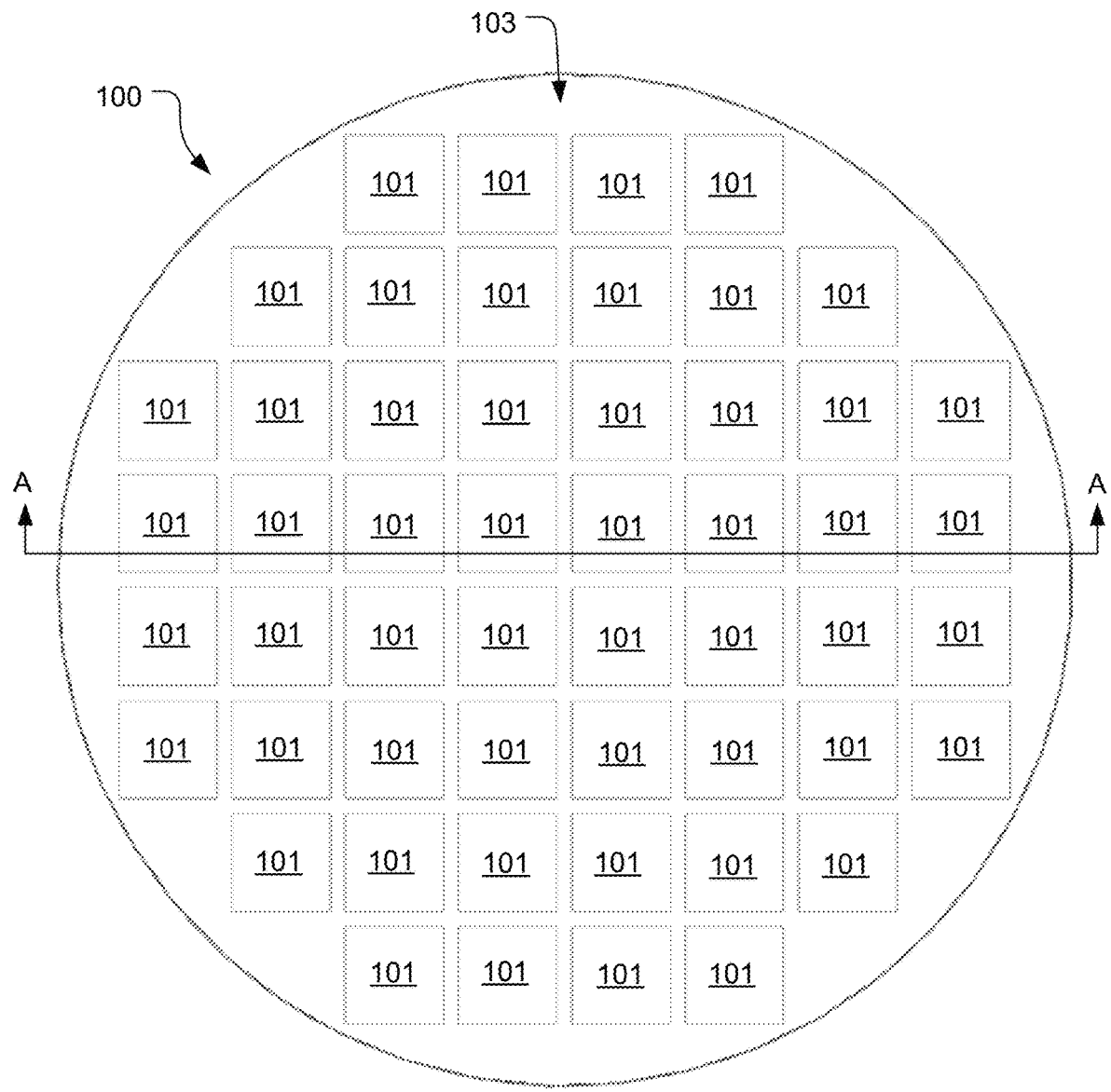
FIG. 1B shows a top view of the wafer of FIG. 1A, in accordance with some embodiments.
Figure 1C:
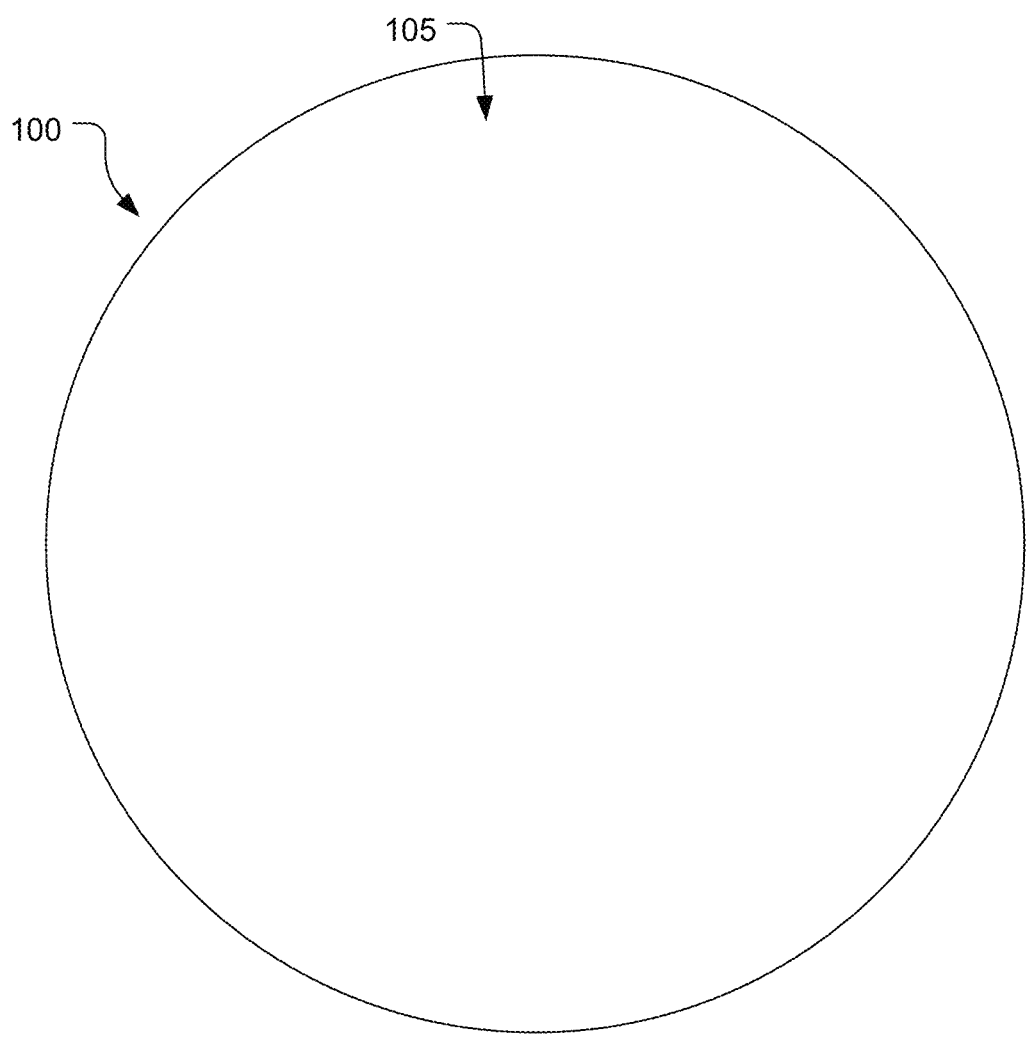
FIG. 1C shows a bottom view of the wafer of FIG. 1A, in accordance with some embodiments.
Figure 1D:
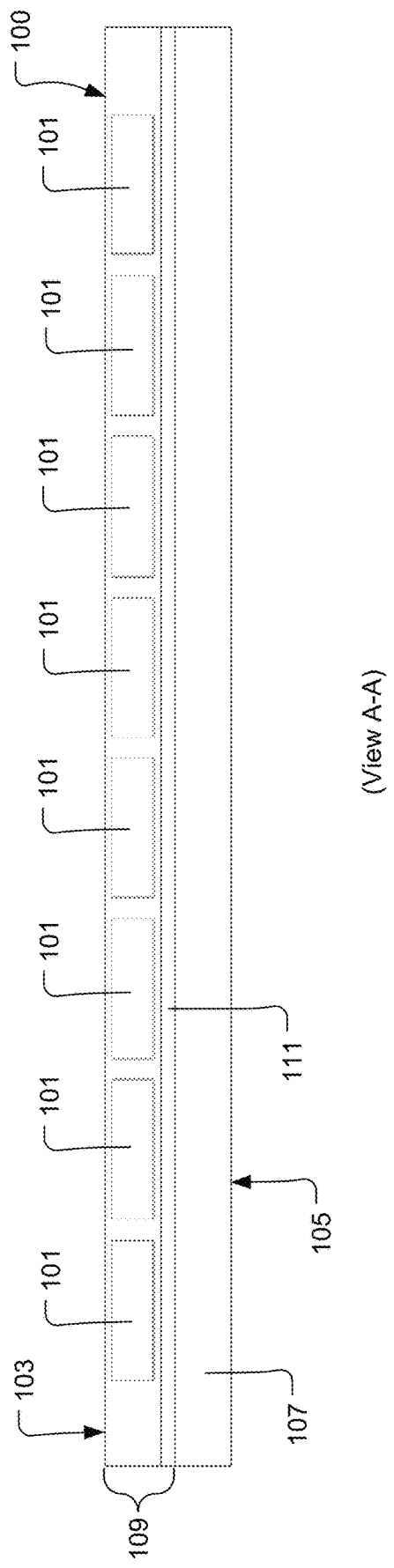
FIG. 1D shows a vertical cross-section view through the wafer, referenced as View A-A in FIG. 1B, in accordance with some embodiments.

FIG. 1B shows a top view of the wafer 100, in accordance with some embodiments. It should be understood that the top surface 103 of the wafer 100 corresponds to the side of the wafer 100 on which semiconductor fabrication processes are performed to deposit, remove, modify, and shape various materials to fabricate the die 101. FIG. 1C shows a bottom view of the wafer 100, in accordance with some embodiments. It should be understood that the bottom surface 105 of the wafer 100 corresponds to the bottom side of the base substrate, e.g., silicon substrate, with the die 101 fabricated on top of the base substrate. FIG. 1D shows a vertical cross-section view through the wafer 100, referenced as View A-A in FIG. 1B, in accordance with some embodiments.

Silicon photonics waveguides are often designed in the body silicon of SOI wafers that exists above the lower portion 111 of the front region 109 of the wafer 100, e.g., above the BOX region within the lower portion 111 of the front region 109 of the wafer 100. In some embodiments, when a thickness of the BOX region in an SOI wafer is less than about 1 micrometer, light propagating in body silicon optical waveguides can couple to the silicon base layer 107 (silicon handle) located below the BOX region. Also, in some embodiments, when a thickness of the STI regions in a CMOS wafer are less than about 1 micrometer, light propagating in body silicon optical waveguides (at or above the STI regions) can adversely couple to the silicon base layer 107 located below the STI regions. Various methods and associated devices are disclosed herein to mitigate adverse optical coupling between optical waveguides and/or optical devices within the die 101 and a structure located below the front region 109 of the wafer 100.

Figure 2A:
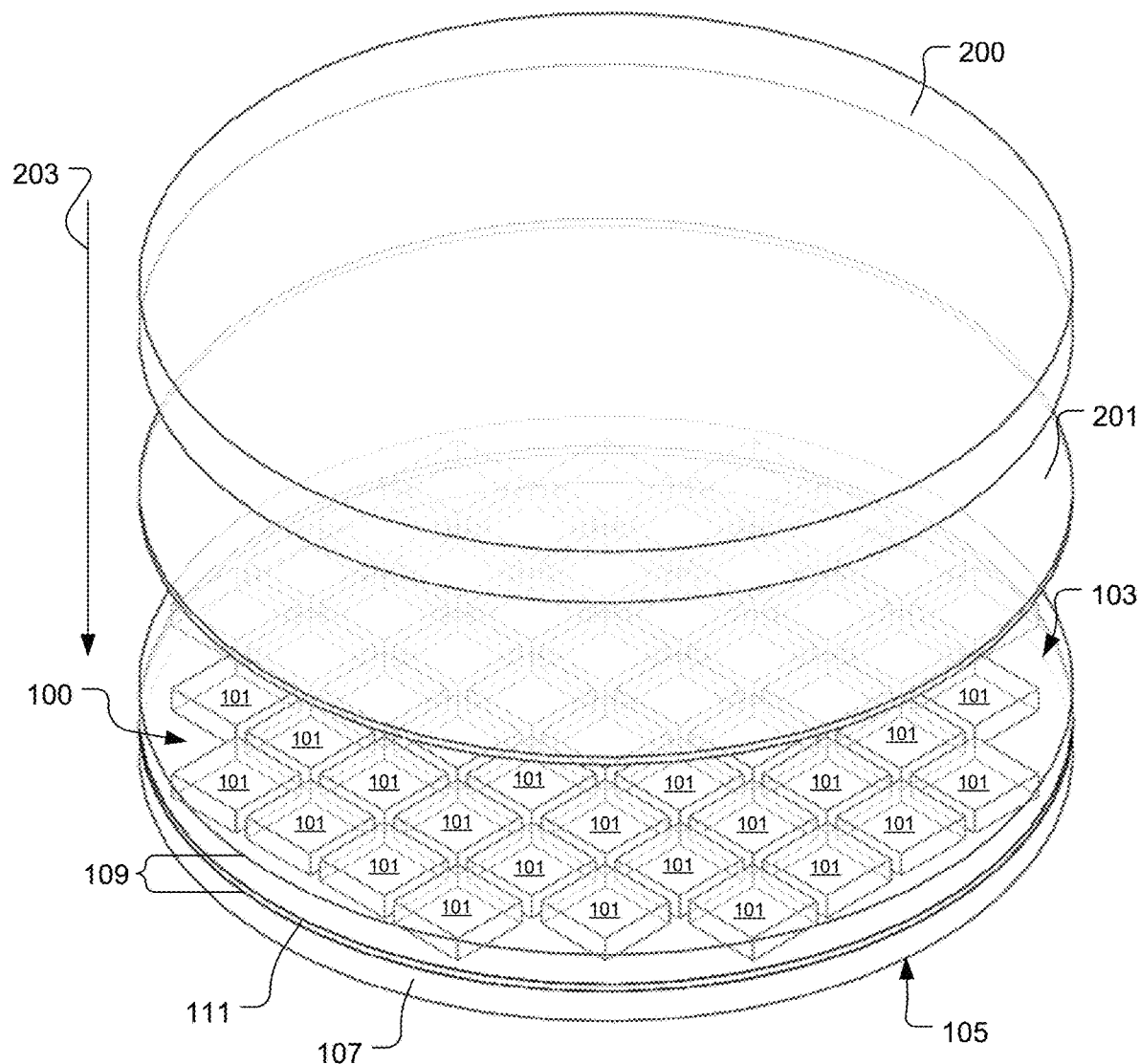
FIG. 2A shows an isometric view of an arrangement for securing/bonding the wafer to a Wafer Support System (WSS) to form a composite wafer assembly, in accordance with some embodiments.
Figure 2B:
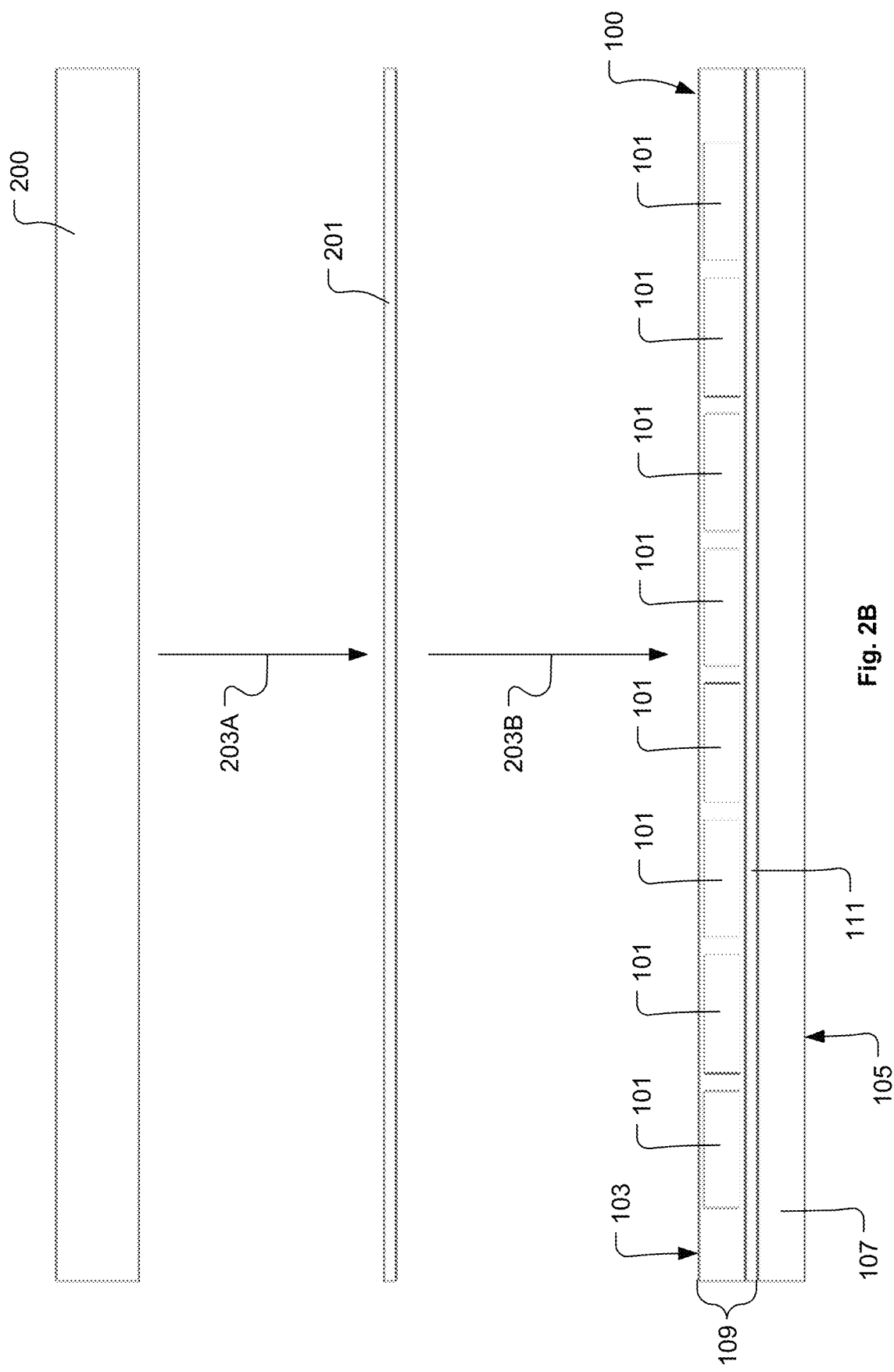
FIG. 2B shows a side view of the arrangement of FIG. 2A, in accordance with some embodiments.
Figure 2C:
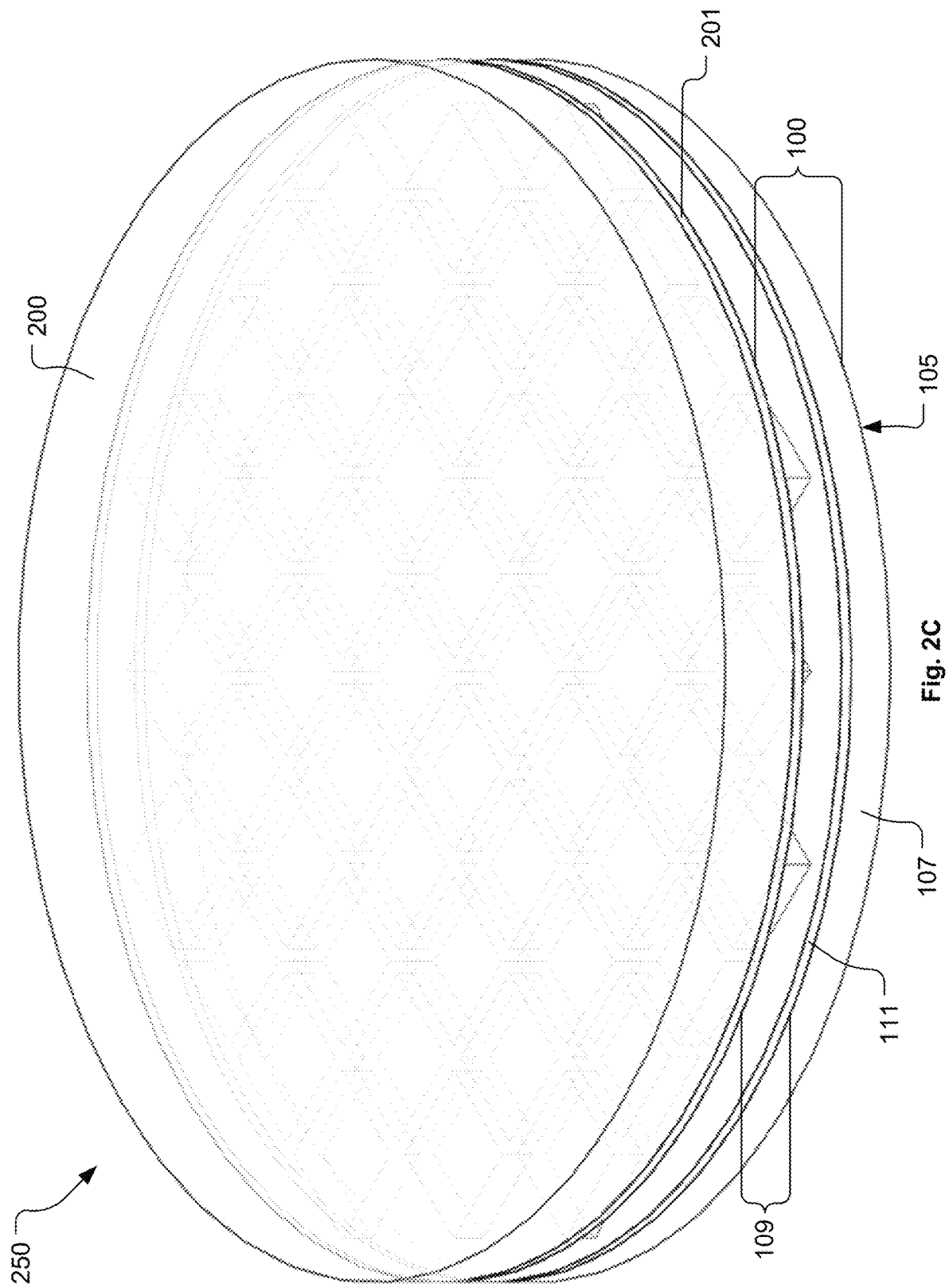
FIG. 2C shows an isometric view of the composite wafer assembly, in accordance with some embodiments.
Figure 2D:
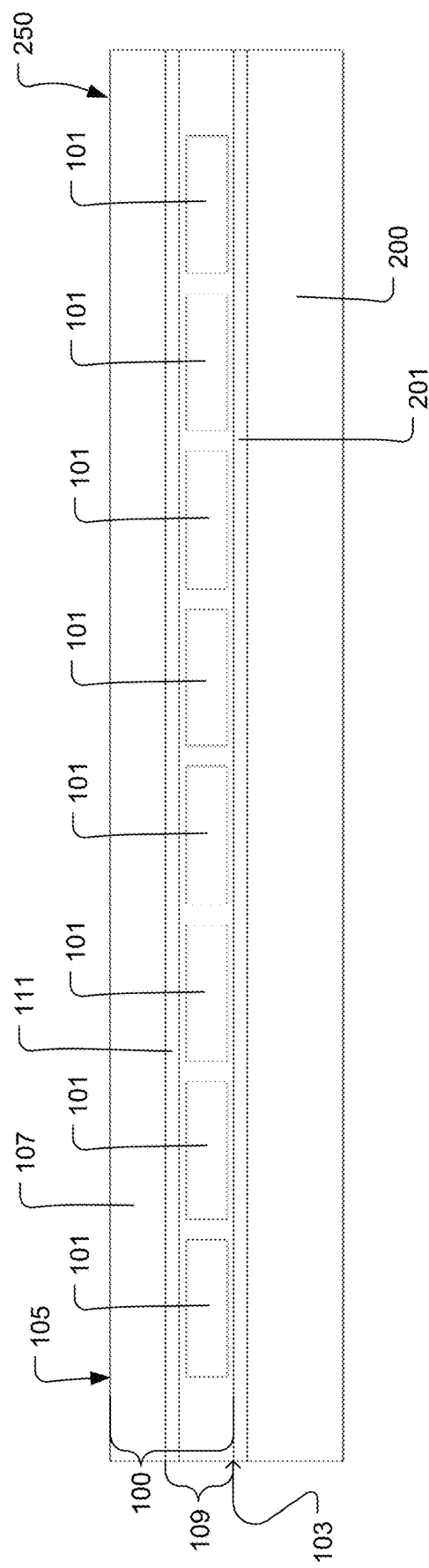
FIG. 2D shows an inverted side view of the composite wafer assembly of FIG. 2C, in accordance with some embodiments.

FIG. 2A shows an isometric view of an arrangement for securing/bonding the wafer 100 to a Wafer Support System (WSS) 200 to form a composite wafer assembly 250, in accordance with some embodiments. FIG. 2B shows a side view of the arrangement of FIG. 2A, in accordance with some embodiments. In some embodiments, the WSS 200 is secured to the top surface 103 of the wafer 100 by an adhesive 201 disposed between the WSS 200 and the top surface 103 of the wafer 100, as indicated by arrow 203 in FIG. 2A, and as indicated by arrows 203A and 203B in FIG. 2B. FIG. 2C shows an isometric view of the composite wafer assembly 250, in accordance with some embodiments. FIG. 2D shows an inverted side view of the composite wafer assembly 250 of FIG. 2C, in accordance with some embodiments. The composite wafer assembly 250 is inverted in FIG. 2D such that the WSS 200 is on the bottom and the base layer 107 of the wafer 100 is on the top. In various embodiments, the WSS 200 can be formed as a silicon wafer or a glass wafer. In some embodiments, the WSS 200 has a diameter that is substantially equal to a diameter of the wafer 100. The WSS 200 is configured to have a vertical thickness that is sufficient to provide for mechanical stability of the composite wafer assembly 250, where the composite wafer assembly 250 includes the combination of the wafer 100 and the WSS 200, with the adhesive 201 disposed between the wafer 100 and the WSS 200. The adhesive 201 is a temporary adhesive that temporarily bonds the wafer 100 to the WSS 200. The adhesive 201 is configured to conform to any variation in topology present on the top surface 103 of the wafer 100. In various embodiments, the adhesive 201 is 3M UV-Curable Adhesive LC-3200, LC-4200, or LC-5200, among other adhesives, by way of example. It should be understood that the adhesive 201 can be essentially any adhesive that is suitable for temporarily securing the wafer 100 to the WSS 200 without causing damage to features present on the top surface 103 of the wafer 100, such that the composite wafer assembly 250 can remain mechanically stable when exposed to mechanical and thermal conditions during subsequent processing of the composite wafer assembly 250. It should be understood that the various structures and components depicted in FIGS. 2A-2D are not drawn to scale, but rather are sized to facilitate description.

Figure 3B:
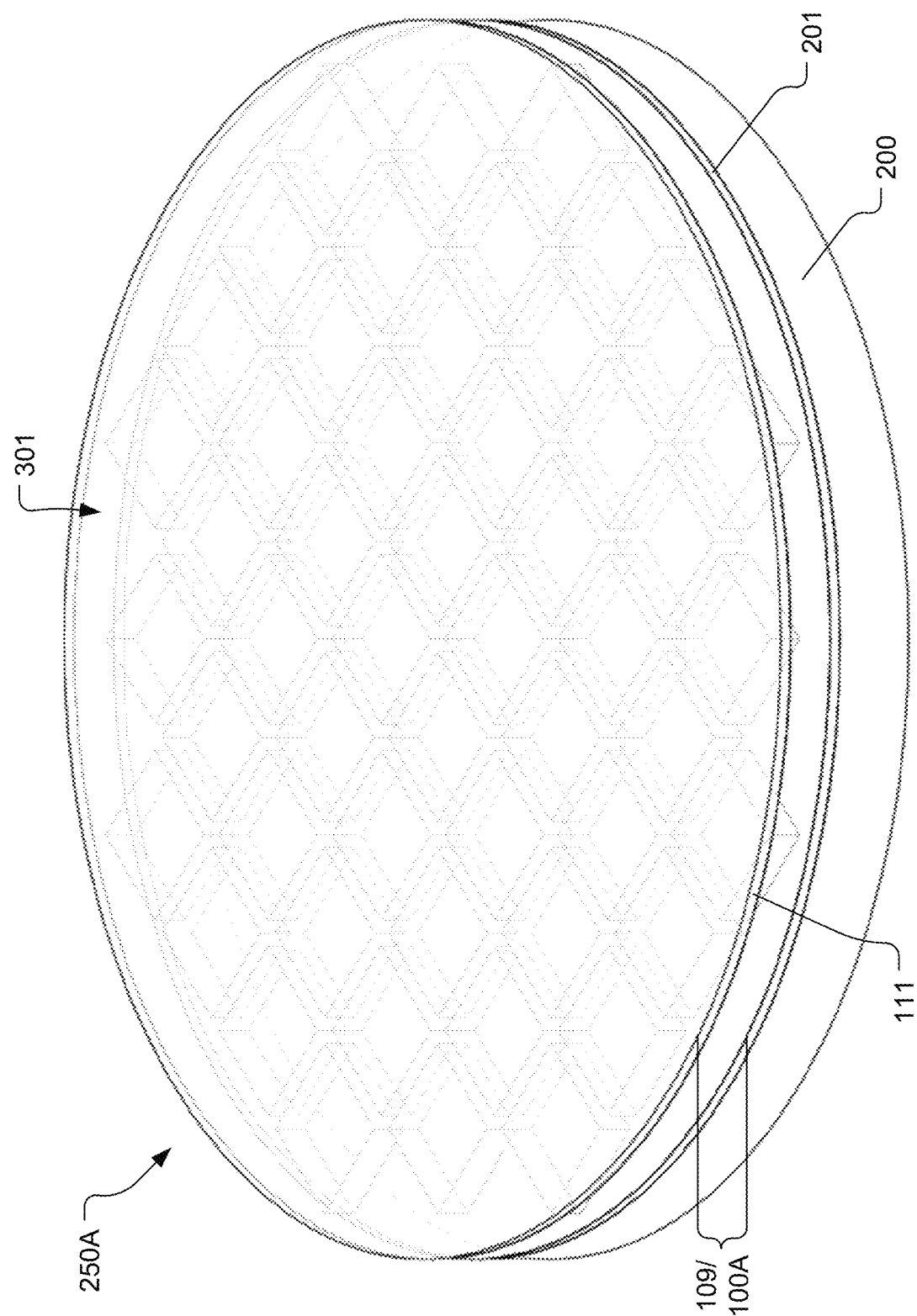
FIG. 3B shows an isometric view of the modified composite wafer assembly of FIG. 3A, in accordance with some embodiments.

FIG. 3A shows an inverted side view of a modified composite wafer assembly 250A corresponding to the composite wafer assembly 250 after removal of the base layer 107 of silicon (e.g., handle silicon) from the bottom of the wafer 100, in accordance with some embodiments. FIG. 3B shows an isometric view of the modified composite wafer assembly 250A of FIG. 3A, in accordance with some embodiments. In some embodiments, a thickness of the base layer 107 is removed from the wafer 100 to expose a target layer within the wafer 100. After removal of the thickness of the base layer 107, the wafer 100 has a new bottom surface 301. In some embodiments, the target layer corresponds to the lower portion 111 of the front region 109 of the wafer 100, such that the base layer 107 is removed to expose the lower portion 111 of the front region 109 of the wafer 100, where the lower portion 111 includes the BOX regions in the case of a SOI wafer, and where the lower portion 111 includes the STI regions in the case of a CMOS wafer.

In various embodiments, removal of the base layer 107 from the wafer 100 can be accomplished using one or more of multiple techniques. For example, in some embodiments, the base layer 107 is ground off or polished off from the bottom of the wafer 100. In some embodiments, the base layer 107 is removed from the wafer 100 by performing a back-grinding process and a chemical mechanical polishing process on the bottom of the wafer 100, followed by performing a reactive ion etch (RIE) process and/or chemical etch process (e.g., using $XeF_2$, KOH, etc.) on the bottom of the wafer 100. In some embodiments, most of the base layer 107 is ground off the bottom of the wafer 100, then the modified composite wafer assembly 250A is cleaned to removal particles (e.g., such as by spin, rinse, dry processing, or other by another cleaning process), then a remaining portion of the base layer 107 is removed from the wafer 100 by an RIE process, with the RIE process using the BOX region within the lower portion 111 of the front region 109 of the wafer 100 as an etch stop layer. In some embodiments, the base layer 107 is removed from the wafer 100 to leave a substantially planar exposed surface of the lower portion 111 of the front region 109 of the wafer 100.

Figure 4A:
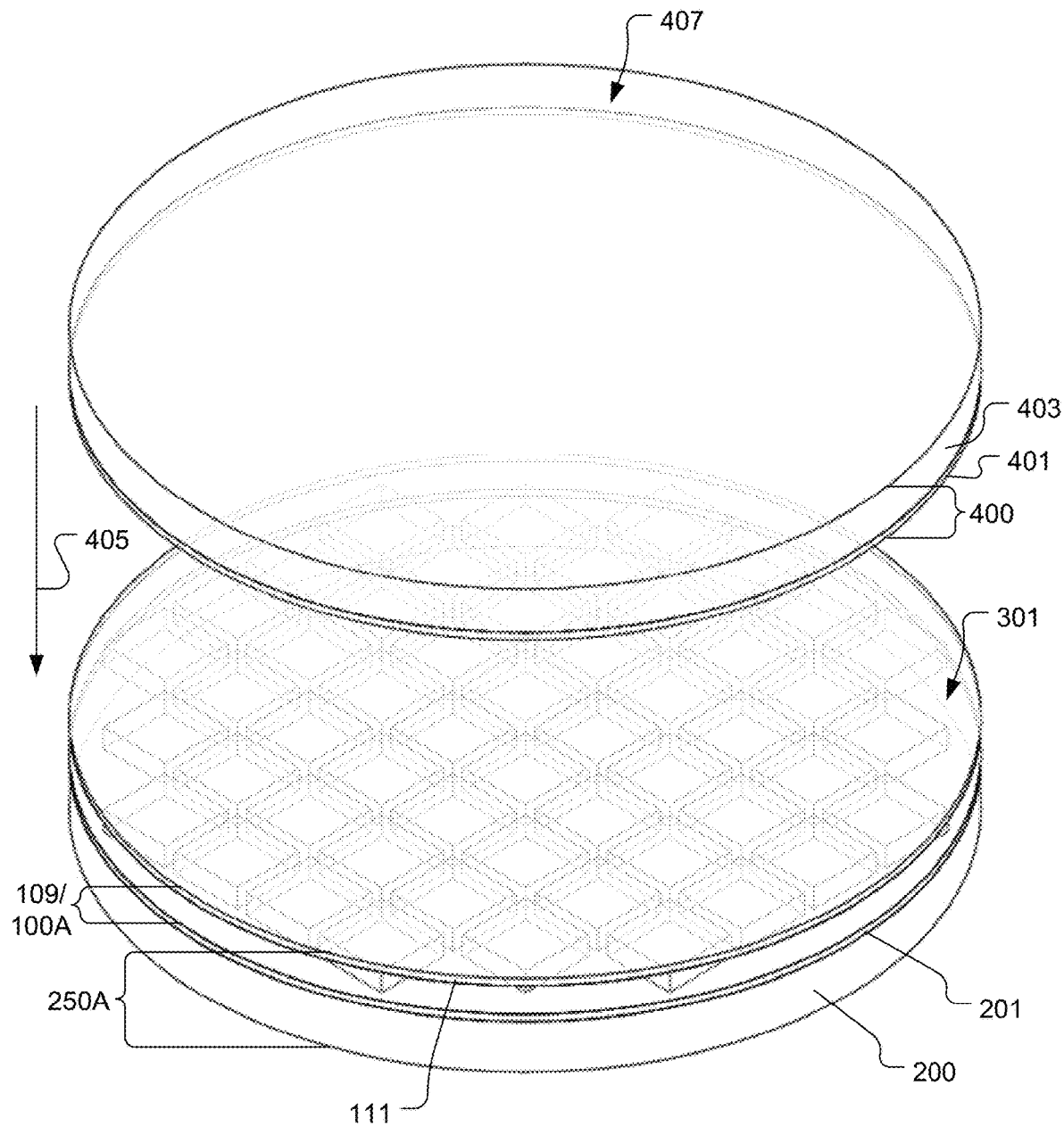
FIG. 4A shows an isometric view of an arrangement for attaching a replacement handle structure to the modified composite wafer assembly to form a handle-integrated composite wafer assembly, in accordance with some embodiments.
Figure 4B:
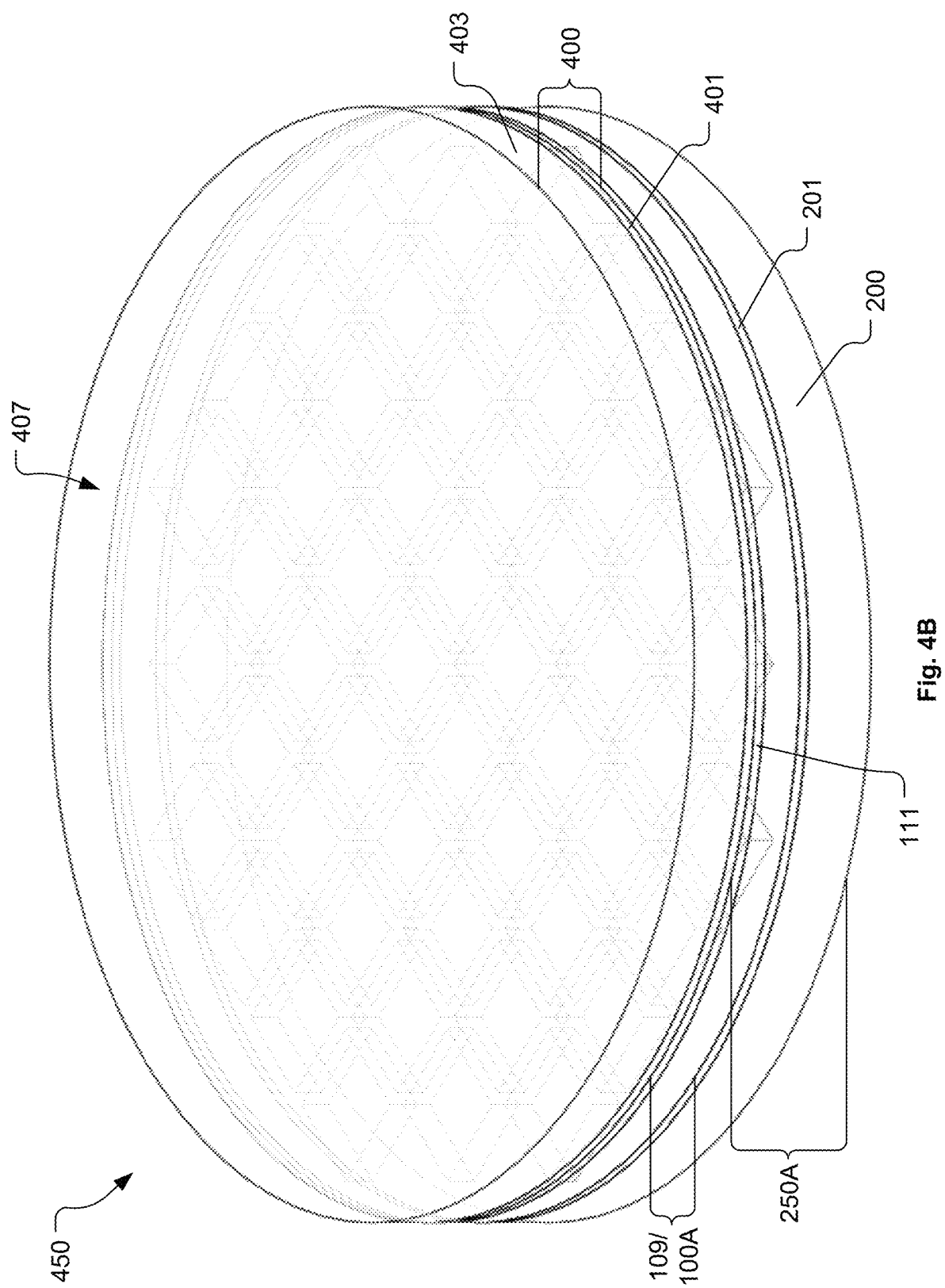
FIG. 4B shows an isometric view of the replacement handle structure attached to the modified composite wafer assembly to form the handle-integrated composite wafer assembly, in accordance with some embodiments.
Figure 4C:
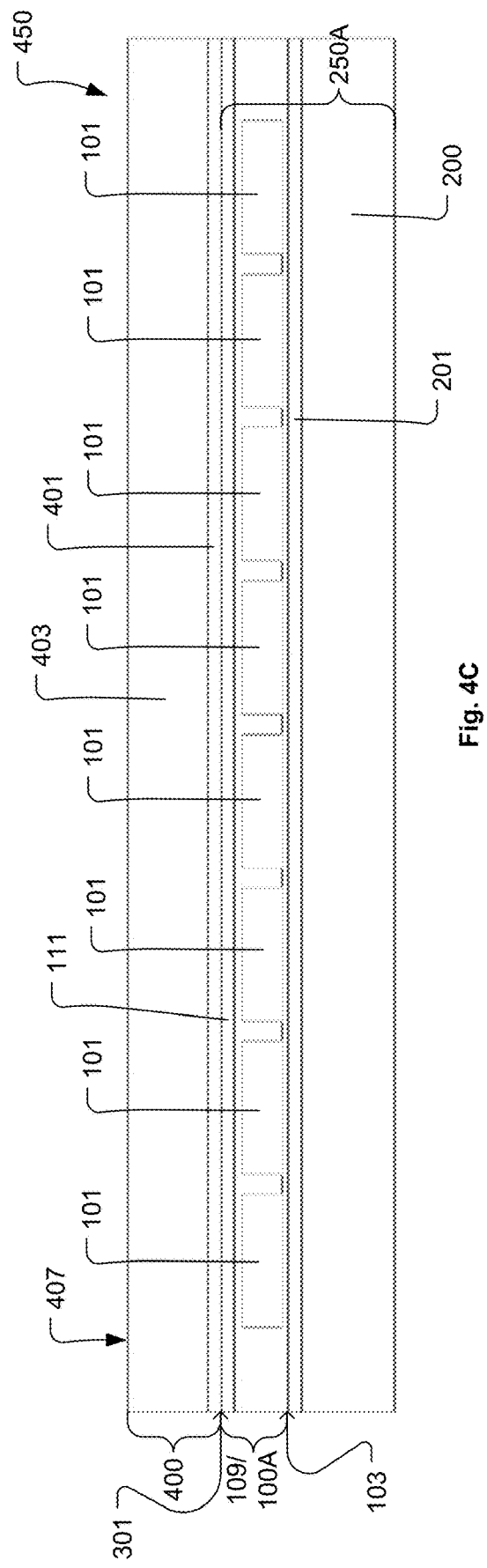
FIG. 4C shows a side view of the handle-integrated composite wafer assembly, in accordance with some embodiments.

FIG. 4A shows an isometric view of an arrangement for attaching a replacement handle structure 400 to the modified composite wafer assembly 250A to form a handle-integrated composite wafer assembly 450, in accordance with some embodiments. In some embodiments, the replacement handle structure 400 that has a wafer shape. The replacement handle structure 400 is attached (permanently bonded) to the new bottom surface 301 of the wafer 100, as indicated by arrow 405. FIG. 4B shows an isometric view of the replacement handle structure 400 attached to the modified composite wafer assembly 250A to form the handle-integrated composite wafer assembly 450, in accordance with some embodiments. FIG. 4C shows a side view of the handle-integrated composite wafer assembly 450, in accordance with some embodiments. It should be understood that the various structures and components depicted in FIGS. 4A-4C are not drawn to scale, but rather are sized to facilitate description.

The replacement handle structure 400 includes a first thickness region 401 and a second thickness region 403. The first thickness region 401 is positioned closest to the new bottom surface 301 of the wafer 100 relative to the second thickness region 403. The first thickness region 401 is formed of an optical cladding material that mitigates optical coupling between optical devices within the die 101 and the replacement handle structure 400. The first thickness region 401 extends into the replacement handle structure 400 from a bond surface 405 of the replacement handle structure 400, where the bond surface 405 is positioned adjacent to the new bottom surface 301 of the wafer 100. The second thickness region 403 extends into the replacement handle structure 400 from an exterior planar surface 407 of the replacement handle structure 400.

The replacement handle structure 400 is a replacement/new handle for the base layer 107 that was removed from the bottom of the wafer 100 to form the modified composite wafer assembly 250A. In various embodiments, the replacement handle structure 400 is formed of glass or silicon or of another suitable material. In some embodiments, the replacement handle structure 400 has a vertical thickness (as measured in a direction substantially perpendicular to the new bottom surface 301 of the wafer 100) within a range extending from about 20 micrometers to about 725 micrometers. In some embodiments, the first thickness region 401 of the replacement handle structure 400 has a vertical thickness greater than or equal to about 1 micrometer, and the second thickness region 403 of the replacement handle structure 400 has a vertical thickness greater than or equal to about 50 micrometers. In some embodiments, the vertical thickness of the replacement handle structure 400 is about 125 micrometers. In some embodiments, the vertical thickness of the replacement handle structure 400 is set so that an overall vertical thickness of the handle-integrated composite wafer assembly 450 is about the same as a typical full thickness of a blank silicon wafer substrate used for CMOS integrated circuit fabrication.

In various embodiments, attachment of the replacement handle structure 400 to the new bottom surface 301 of the wafer 100 is done by fusion bonding, adhesive bonding, anodic bonding, or another type of bonding. In some embodiments, fusion bonding is used to bond silicon-to-silicon, glass-to-glass, polymethyl methacrylate (PMMA)-to-PMMA, etc. In some embodiments, anodic bonding is used to bond silicon-to-glass. Also, in some embodiments, various adhesives can be used to attach the replacement handle structure 400 to the new bottom surface 301 of the wafer 100. In some embodiments, where the first thickness region 401 of the replacement handle structure 400 is formed of silicon dioxide and the wafer 100 is an SOI wafer with BOX exposed at the new bottom surface 301 of the wafer 100, the first thickness region 401 of the replacement handle structure 400 is fusion bonded to the new bottom surface 301 of the wafer 100. In some embodiments, where the first thickness region 401 of the replacement handle structure 400 includes a dielectric film. In various embodiments, the dielectric film within the first thickness region 401 of the replacement handle structure 400 is formed of silicon dioxide, silicon nitride, various polymers (such as benzocyclobutene (BCB), polymethyl methacrylate (PMMA), polyimide, among others), or combinations thereof (e.g., two or more of silicon dioxide, silicon nitride, and polymer). In some embodiments, a sum of the vertical thickness of the dielectric film within the first thickness region 401 of the replacement handle structure 400 and a vertical thickness of the BOX region within the SOI wafer is greater than about 1 micrometer.

In some embodiments, an adhesive is used to attach the replacement handle structure 400 to the new bottom surface 301 of the wafer 100. In these embodiments, an adhesive vertical thickness of greater than or equal to about 1 micrometer will prevent optical coupling of light within optical waveguides/devices within the die 101 with material in the second thickness region 403 of the replacement handle structure 400. In these embodiments, when the adhesive prevents optical coupling between the die 101 and the second thickness region 403 of the replacement handle structure 400, the dielectric film within the first thickness region 401 of the replacement handle structure 400 can have any vertical thickness. In some embodiments, the dielectric film within the first thickness region 401 of the replacement handle structure 400 is formed to include a stack of a first layer of silicon dioxide, a layer of silicon nitride, and a second layer of silicon dioxide, where the first layer of silicon dioxide is positioned closest to the new bottom surface 301 of the wafer 100 relative to the second layer of silicon dioxide, and where the layer of silicon nitride is positioned between the first and second layers of silicon dioxide. In some embodiments, the first layer of silicon dioxide has a vertical thickness of about 0.1 nanometer, and the layer of silicon nitride has a vertical thickness of about 100 nanometers, and the second layer of silicon dioxide has a vertical thickness of about 1 micrometer.

Figure 5A:
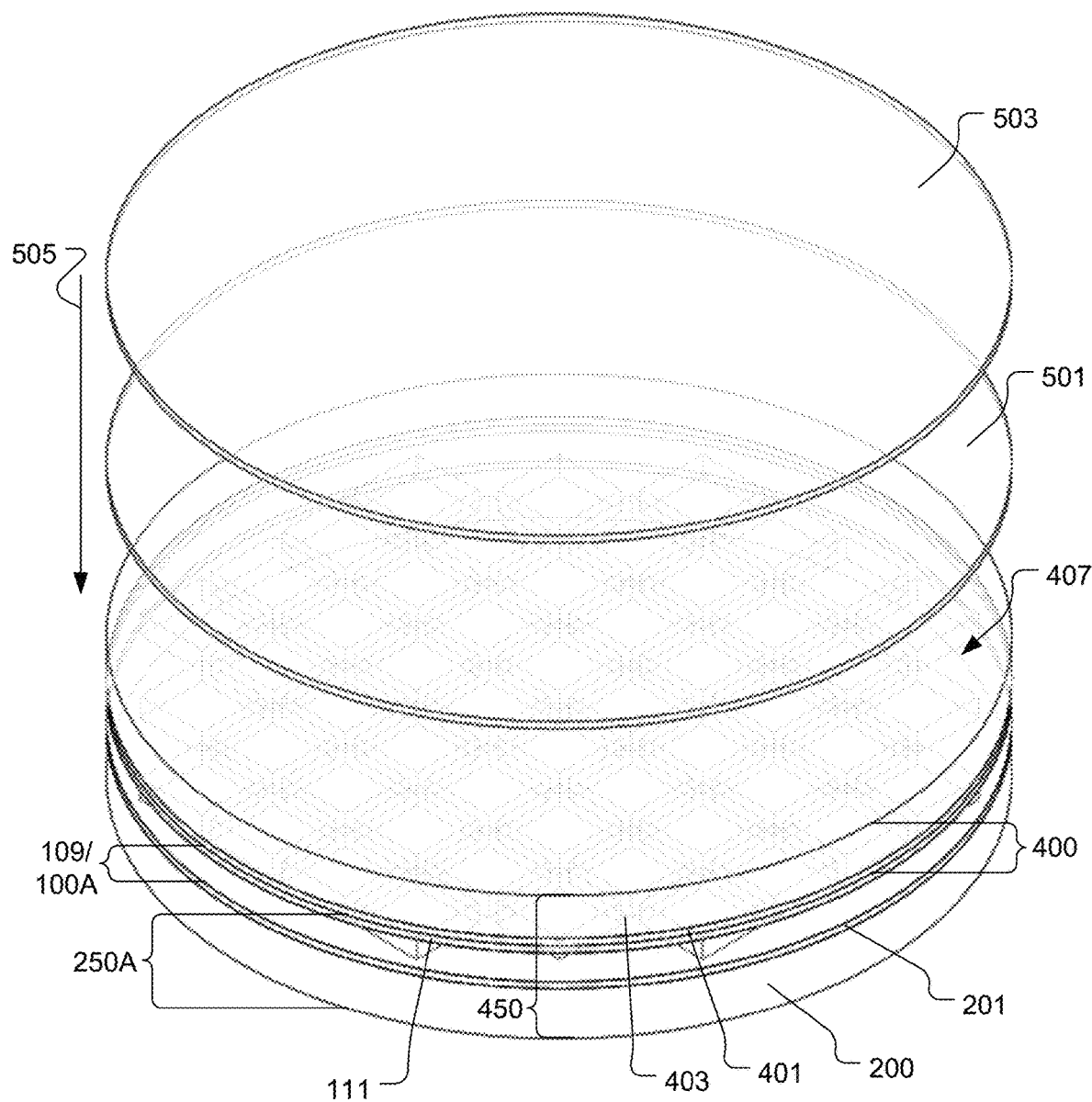
FIG. 5A shows deposition of a hardmask material on the exterior planar surface of the replacement handle structure of the handle-integrated composite wafer assembly, followed by deposition of a photoresist material on the hardmask material, in accordance with some embodiments.
Figure 5B:
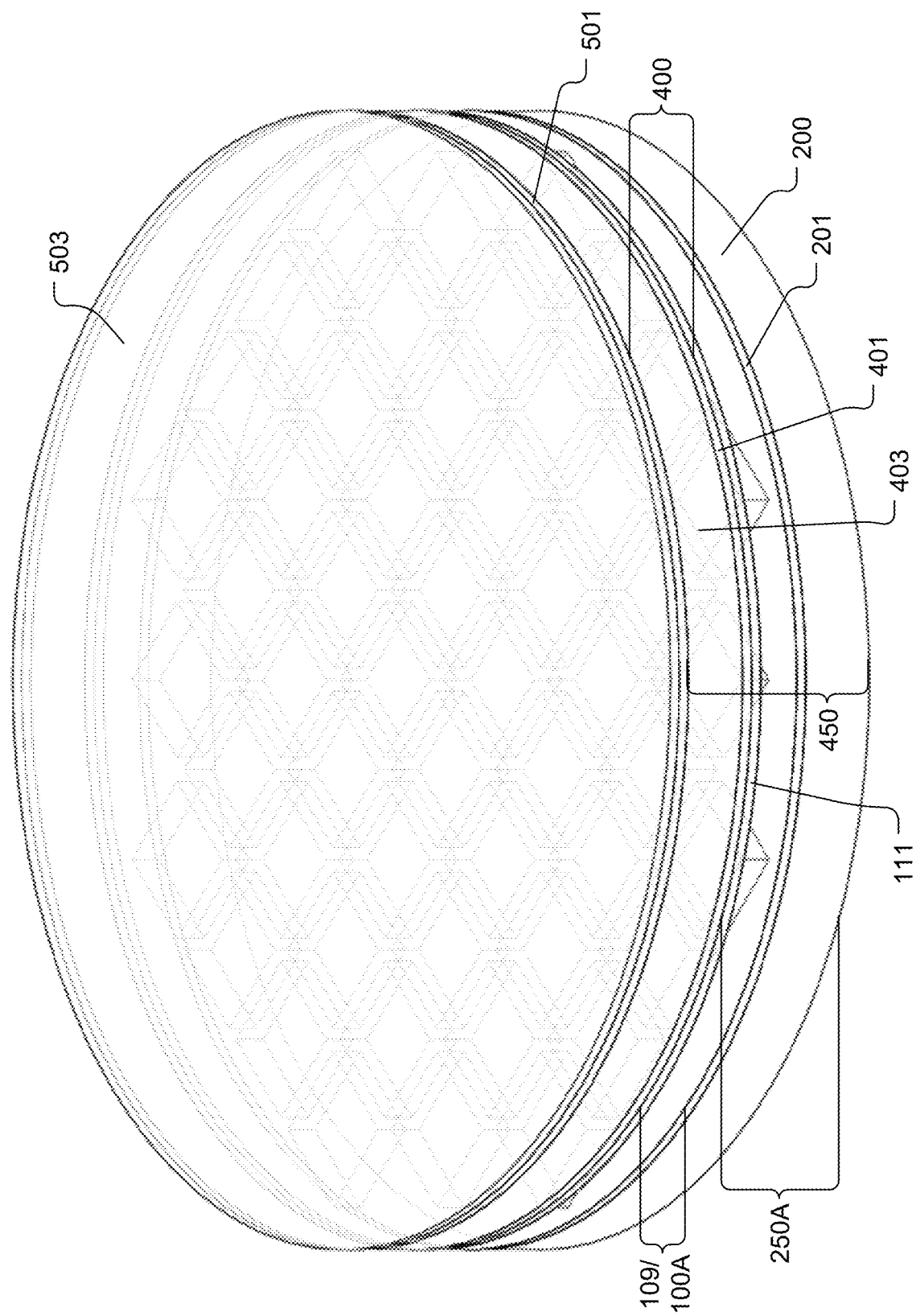
FIG. 5B shows an isometric view of the handle-integrated composite wafer assembly having the hardmask material and the photoresist material deposited thereon, in accordance with some embodiments.
Figure 5C:
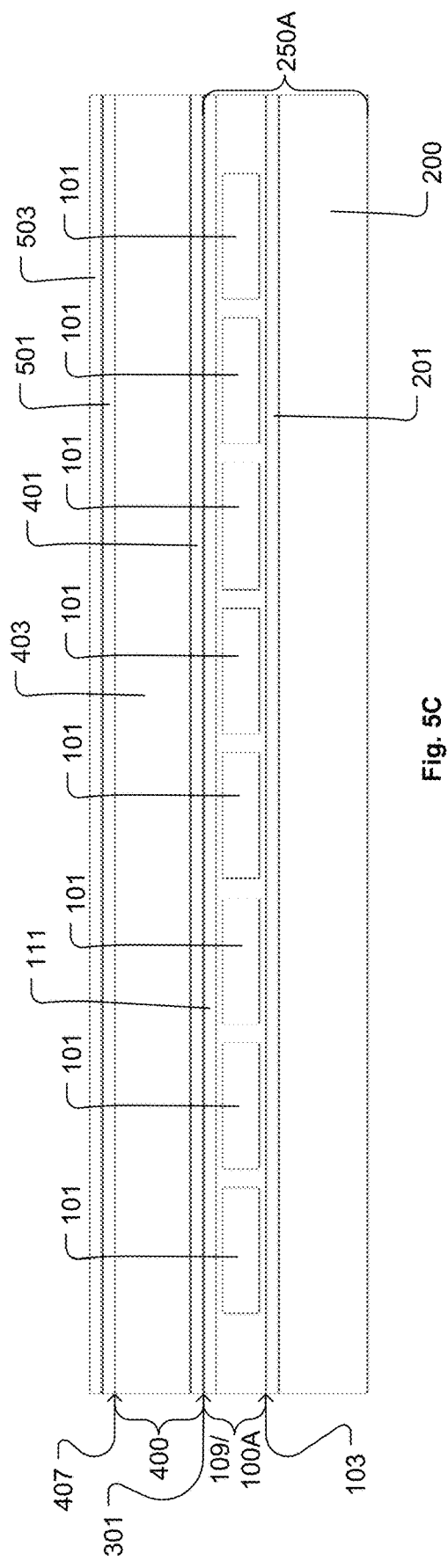
FIG. 5C shows a side view of the handle-integrated composite wafer assembly having the hardmask material and the photoresist material deposited thereon, in accordance with some embodiments.

FIG. 5A shows deposition of a hardmask material 501 on the exterior planar surface 407 of the replacement handle structure 400 of the handle-integrated composite wafer assembly 450, followed by deposition of a photoresist material 503 on the hardmask material 501, as indicated by arrow 505, in accordance with some embodiments. FIG. 5B shows an isometric view of the handle-integrated composite wafer assembly 450 having the hardmask material 501 and the photoresist material 503 deposited thereon, in accordance with some embodiments. FIG. 5C shows a side view of the handle-integrated composite wafer assembly 450 having the hardmask material 501 and the photoresist material 503 deposited thereon, in accordance with some embodiments. In some embodiments, the hardmask material 501 is deposited as a layer across the exterior planar surface 407 of the replacement handle structure 400 of the handle-integrated composite wafer assembly 450. In some embodiments, the hardmask material 501 is silicon nitride or silicon oxide or another type of hardmask material. In some embodiments, the hardmask material 501 has a vertical thickness of up to about 200 nanometers. In some embodiments, the photoresist material 503 is deposited as a layer across the hardmask material 501.

Figure 6B:
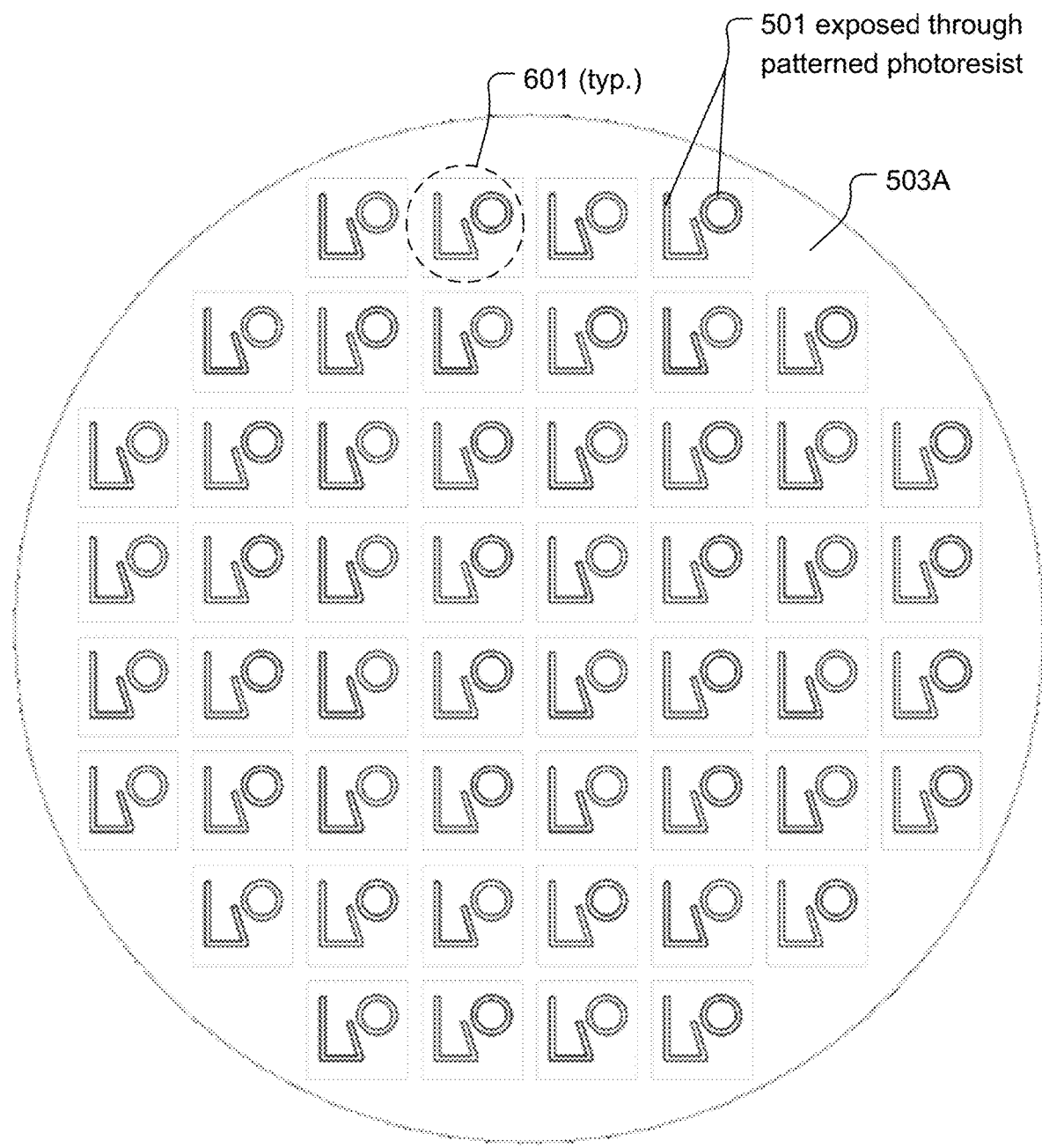
FIG. 6B shows a top view of the patterned and exposed photoresist material in the configuration of FIG. 6A, in accordance with some embodiments.

The photoresist material 503 is patterned and developed using standard photolithography processing techniques to form a pattern 601 in the photoresist material 503 that exposes portions of the underlying hardmask material 501. In some embodiments, the pattern 601 is formed in the photoresist over each of the die 101 within the handle-integrated composite wafer assembly 450. In some embodiments, the same pattern 601 is formed over each of the die 101. Therefore, in order to avoid unnecessarily obscuring the drawings, one of the patterns 601 is referenced as a typical pattern 601. In some embodiments, different patterns 601 are formed over different die 101. It should be understood that the shape of the pattern 601 as shown in the drawings is provided to facilitate description. In various embodiments, the pattern 601 can be of essentially any shape and size, and include any number of openings, as needed for a given application. In some embodiments, the pattern 601 is configured and positioned to align with particular features within the die 101, such as with electrical circuit components and/or optical components. In various embodiments, alignment of the pattern 601 to correspond with the particular features with the die 101 is achieved using infrared cameras or any of the techniques described in U.S. patent application Ser. No. 15/646,039, published as U.S. Patent Application Publication No. US-2018-0019139-A1, on Jan. 18, 2018, which is incorporated in its entirety herein by reference. FIG. 6A shows an isometric view of the handle-integrated composite wafer assembly 450 having the hardmask material 501 and the photoresist material 503 deposited thereon, with the photoresist material 503 patterned and developed to expose portions of the underlying hardmask material 501, in accordance with some embodiments. FIG. 6B shows a top view of the patterned and exposed photoresist material 503 in the configuration of FIG. 6A, in accordance with some embodiments.

Figure 6D:
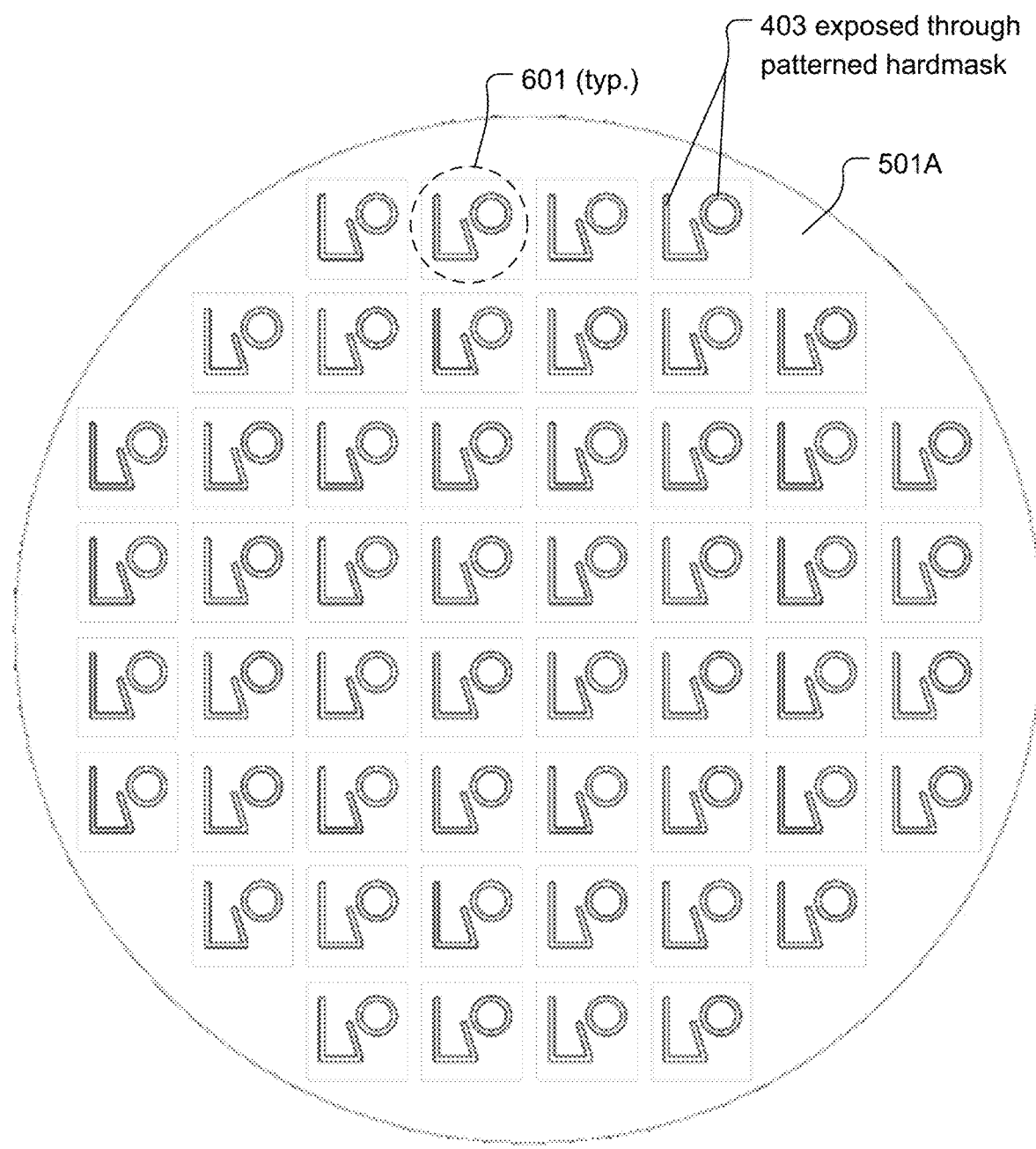
FIG. 6D shows a top view of the patterned hardmask material in the configuration of FIG. 6C, in accordance with some embodiments.

The hardmask material 501 is etched through the openings in the photoresist material 503 corresponding to the patterns 601, such that the patterns 601 are transferred into the hardmask material 501. In this manner, the photoresist material 503 protects the hardmask material 501 that is not to be etched, i.e., that is not part of the patterns 601. In some embodiments, the patterns 601 in the hardmask material 501 are etched down to the exterior planar surface 407 of the replacement handle structure 400. After etching of the patterns 601 through the hardmask material 501, the photoresist material 503 is removed and the handle-integrated composite wafer assembly 450 having the patterned hardmask material 501 thereon is cleaned. FIG. 6C shows an isometric view of the handle-integrated composite wafer assembly 450 having the patterned hardmask material 501 thereon, in accordance with some embodiments. FIG. 6D shows a top view of the patterned hardmask material 501 in the configuration of FIG. 6C, in accordance with some embodiments.

The replacement handle structure 400 is etched through the openings in the hardmask material 501 corresponding to the patterns 601, such that cavities corresponding to the patterns 601 are formed within the replacement handle structure 400. In this manner, the hardmask material 501 protects the replacement handle structure 400 that is not to be etched, i.e., that is not part of the patterns 601. In some embodiments, the cavities corresponding to the patterns 601 are etched down through the replacement handle structure 400 to a target layer. In some embodiments, the target layer is the BOX material in the lower portion 111 of the front region 109 of the wafer 100, or STI region material in the lower portion 111 of the front region 109 of the wafer 100.

In some embodiments, the first thickness region 401 of the replacement handle structure 400 is formed of silicon dioxide having a thickness of about 1 micrometer, and the cavities corresponding to the pattern 601 are etched through the replacement handle structure 400 to extend through the first thickness region 401 of the replacement handle structure 400 to the target layer of silicon. In these embodiments, a native oxide having a thickness of less than 0.1 nanometer forms on the silicon exposed within the cavities corresponding to the pattern 601 that are etched through the replacement handle structure 400. In some of these embodiments, a thickness ratio between the replacement handle structure 400 and the native oxide is greater than about 10-to-1.

Figure 7A:
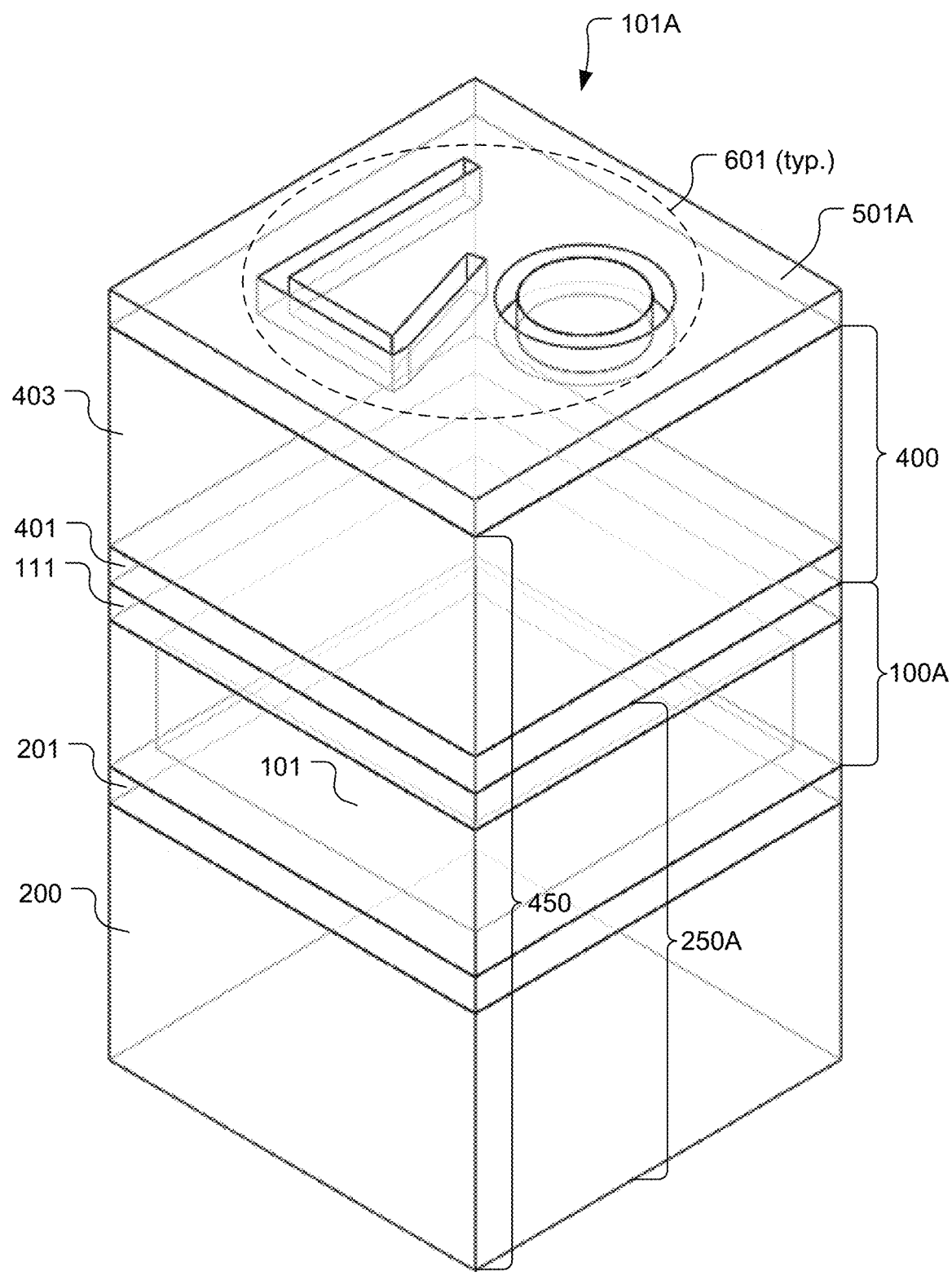
FIG. 7A shows a singulated die singulated from the handle-integrated composite wafer assembly, in accordance with some embodiments.
Figure 7B:
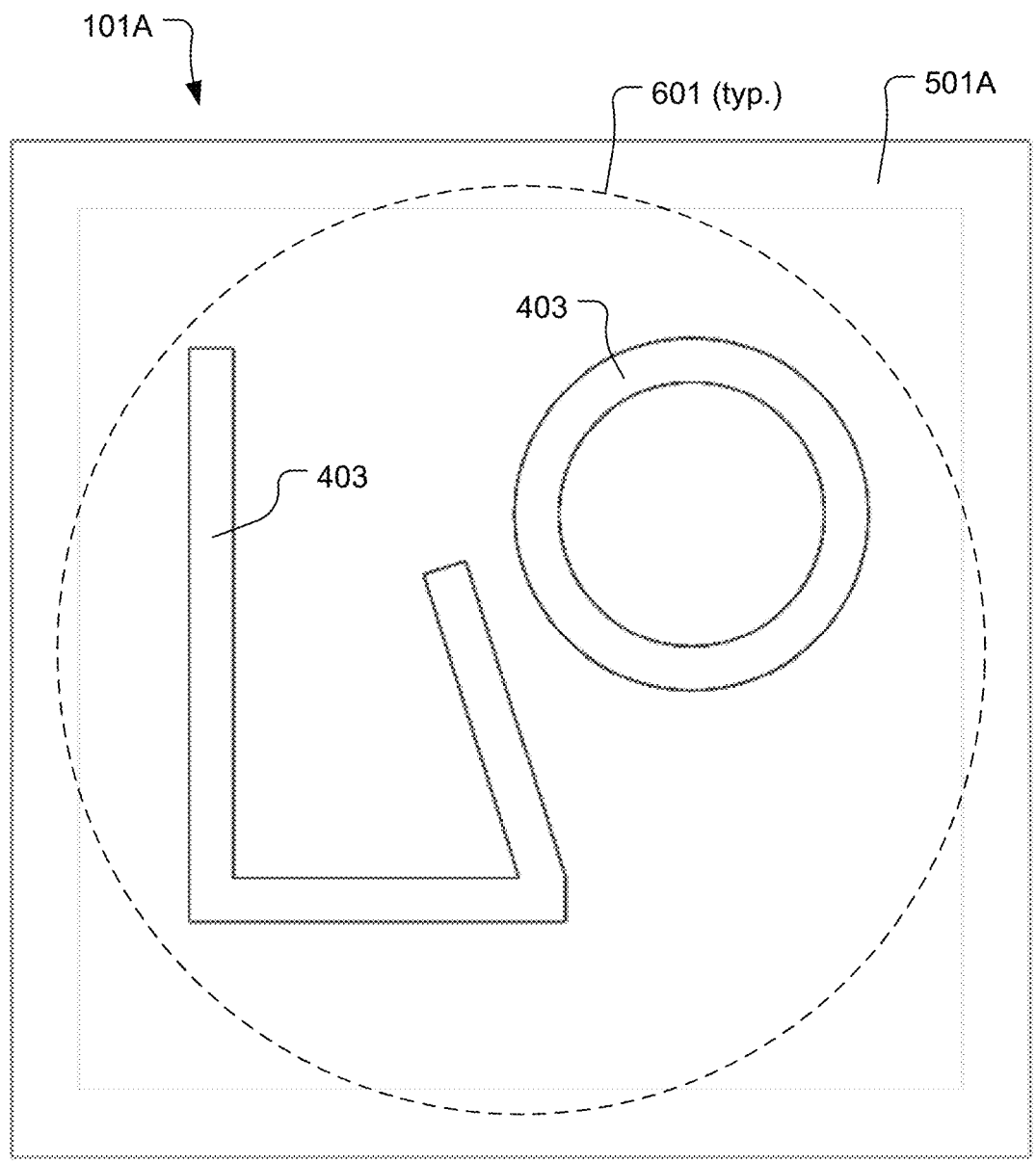
FIG. 7B shows a top view of the singulated die before etching of the replacement handle structure through the openings in the hardmask material, in accordance with some embodiments.
Figure 7C:
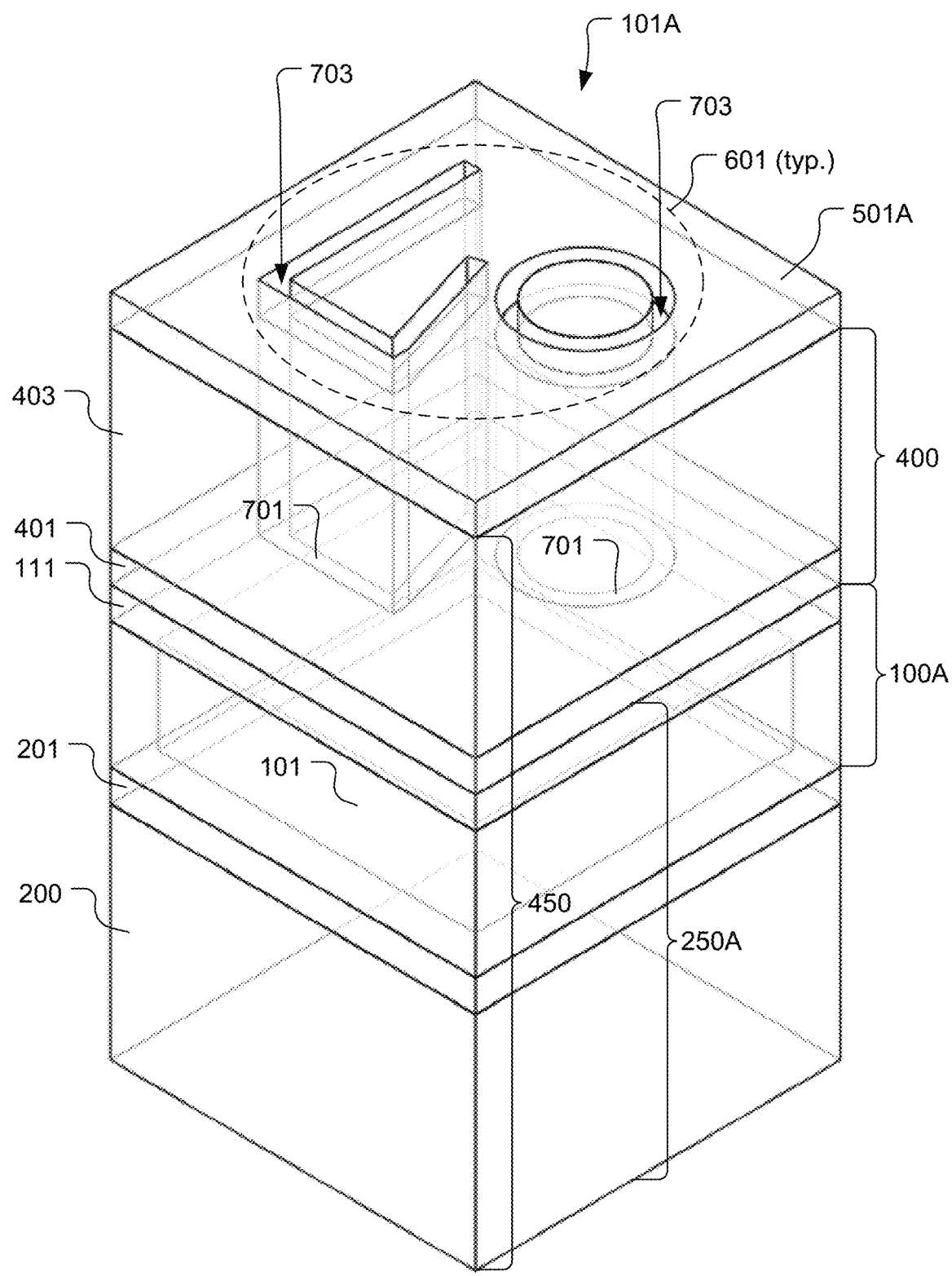
FIG. 7C shows an isometric view of the singulated die after etching of the replacement handle structure through the openings in the hardmask material, in accordance with some embodiments.
Figure 7D:
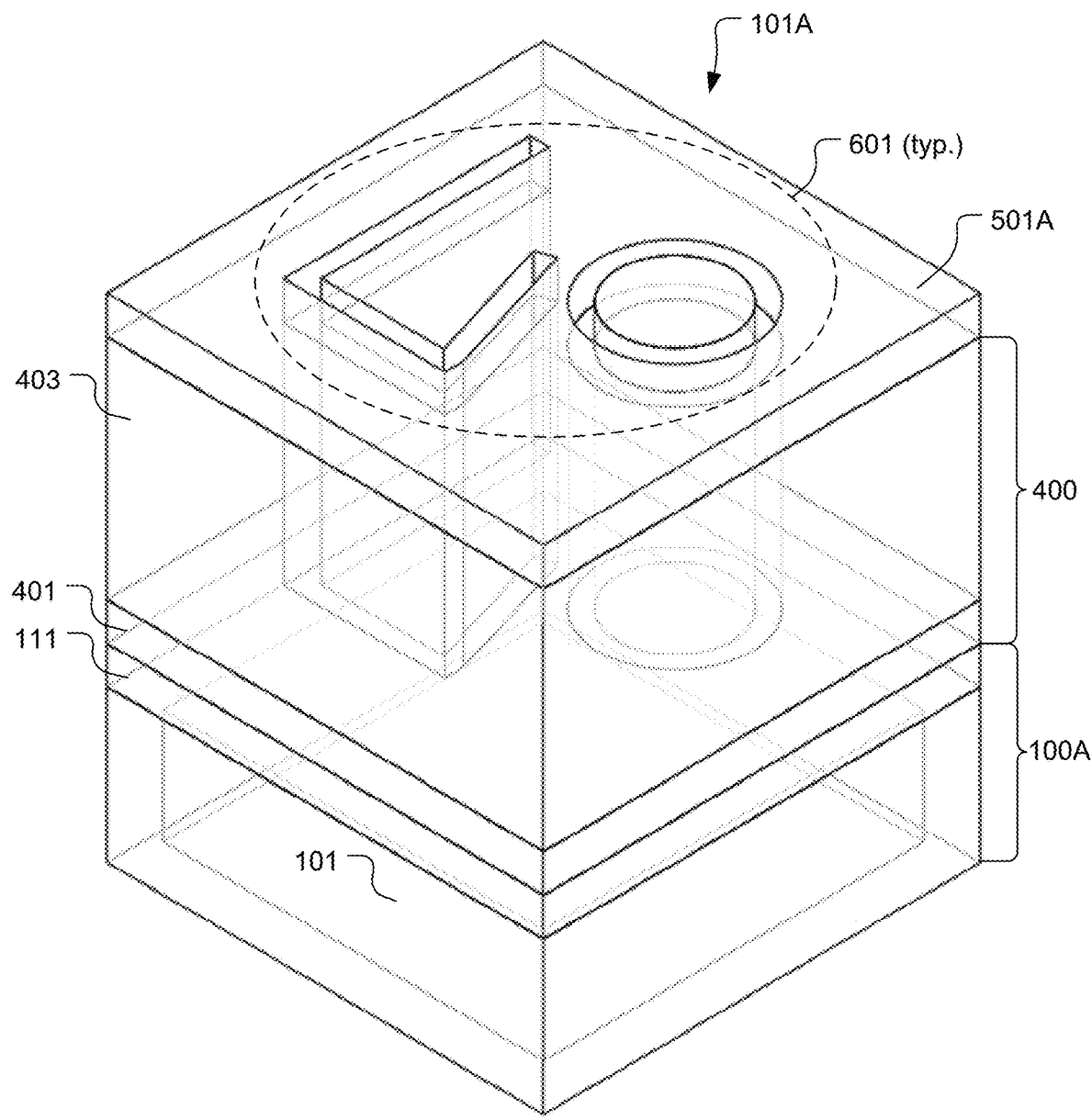
FIG. 7D shows an isometric view of the singulated die after etching of the replacement handle structure through the openings in the hardmask material, and after removal of the WSS and corresponding adhesive, in accordance with some embodiments.
Figure 7E:
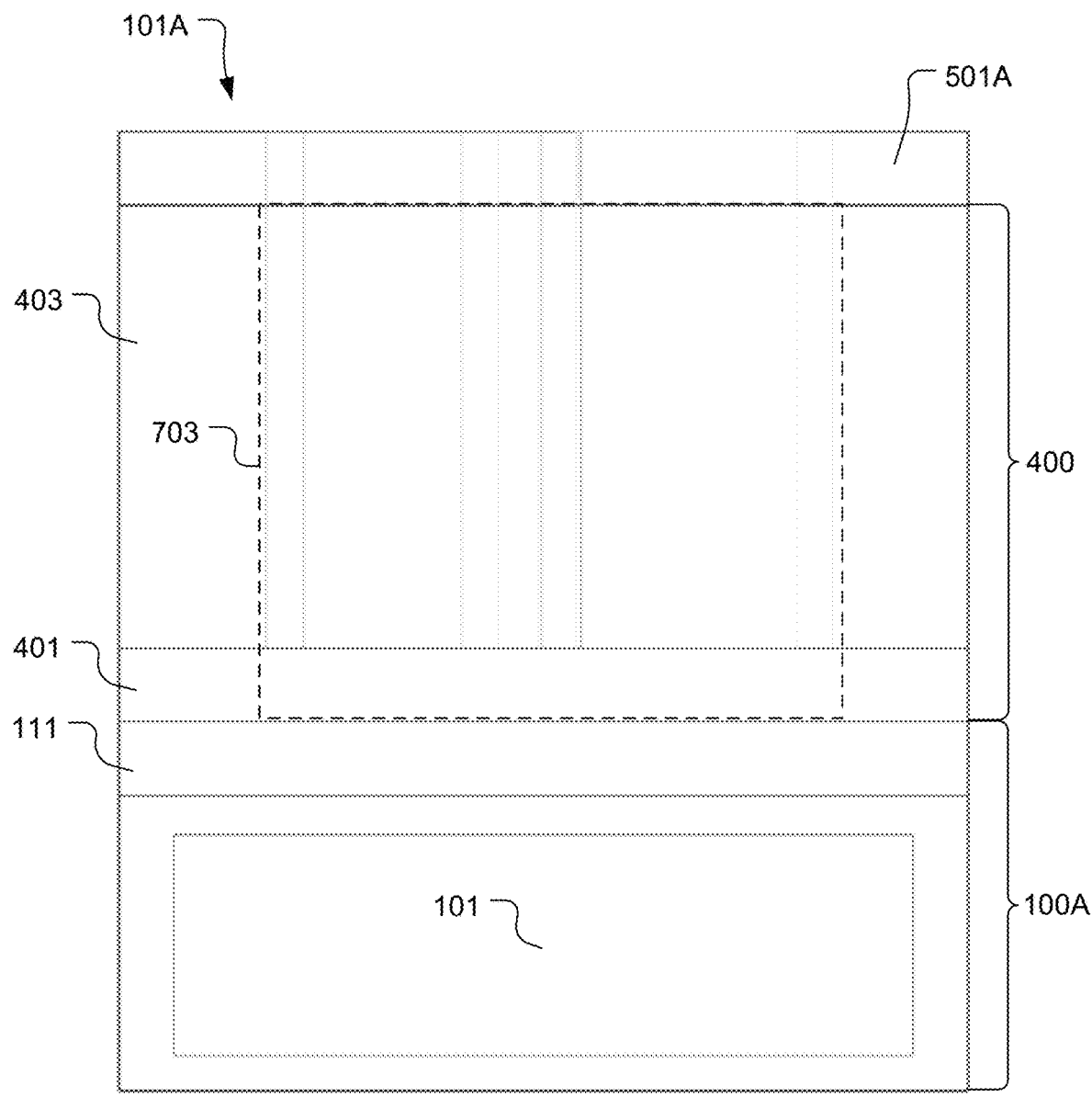
FIG. 7E shows a side view of the singulated die after etching of the replacement handle structure through the openings in the hardmask material, and after removal of the WSS and corresponding adhesive, in accordance with some embodiments.

FIG. 7A shows a singulated die 101A singulated from the handle-integrated composite wafer assembly 450, in accordance with some embodiments. In some embodiments, the singulated die 101A are singulated from the handle-integrated composite wafer assembly 450 before etching of the replacement handle structure 400 through the openings in the hardmask material 501. FIG. 7B shows a top view of the singulated die 101A before etching of the replacement handle structure 400 through the openings in the hardmask material 501, in accordance with some embodiments. The second thickness region 403 of the replacement handle structure 400 is exposed through the pattern 601 formed within the patterned hardmask material 501A. FIG. 7C shows an isometric view of the singulated die 101A after etching of the replacement handle structure 400 through the openings in the hardmask material 501, in accordance with some embodiments. In the example of FIG. 7C, the cavities corresponding to the pattern 601 are etched through the replacement handle structure 400 to expose a target layer 701 within the die 101A. In various embodiments, any of multiple techniques can be used to singulate the die 101 from the handle-integrated composite wafer assembly 450, such as dicing with a saw, dicing with a laser, or dicing with RIE. In some embodiments, the WSS 200 is removed from the handle-integrated composite wafer assembly 450 prior to singulation of the die 101 from the handle-integrated composite wafer assembly 450. In some embodiments, such as shown in FIG. 7A, the WSS 200 is retained within the handle-integrated composite wafer assembly 450 during singulation of the die 101 from the handle-integrated composite wafer assembly 450. FIG. 7D shows an isometric view of the singulated die 101A after etching of the replacement handle structure 400 through the openings in the hardmask material 501, and after removal of the WSS 200 and corresponding adhesive 201, in accordance with some embodiments. In some embodiments, the hardmask material 501A is left on the singulated die 101A after etching of the replacement handle structure 400. In some embodiments, the hardmask material 501A is removed from the singulated die 101A after etching of the replacement handle structure 400. FIG. 7E shows a side view of the singulated die 101A after etching of the replacement handle structure 400 through the openings in the hardmask material 501, and after removal of the WSS 200 and corresponding adhesive 201, in accordance with some embodiments. FIG. 7E shows cavities 703 corresponding to the pattern 601 formed through replacement handle structure 400.

Figure 8:
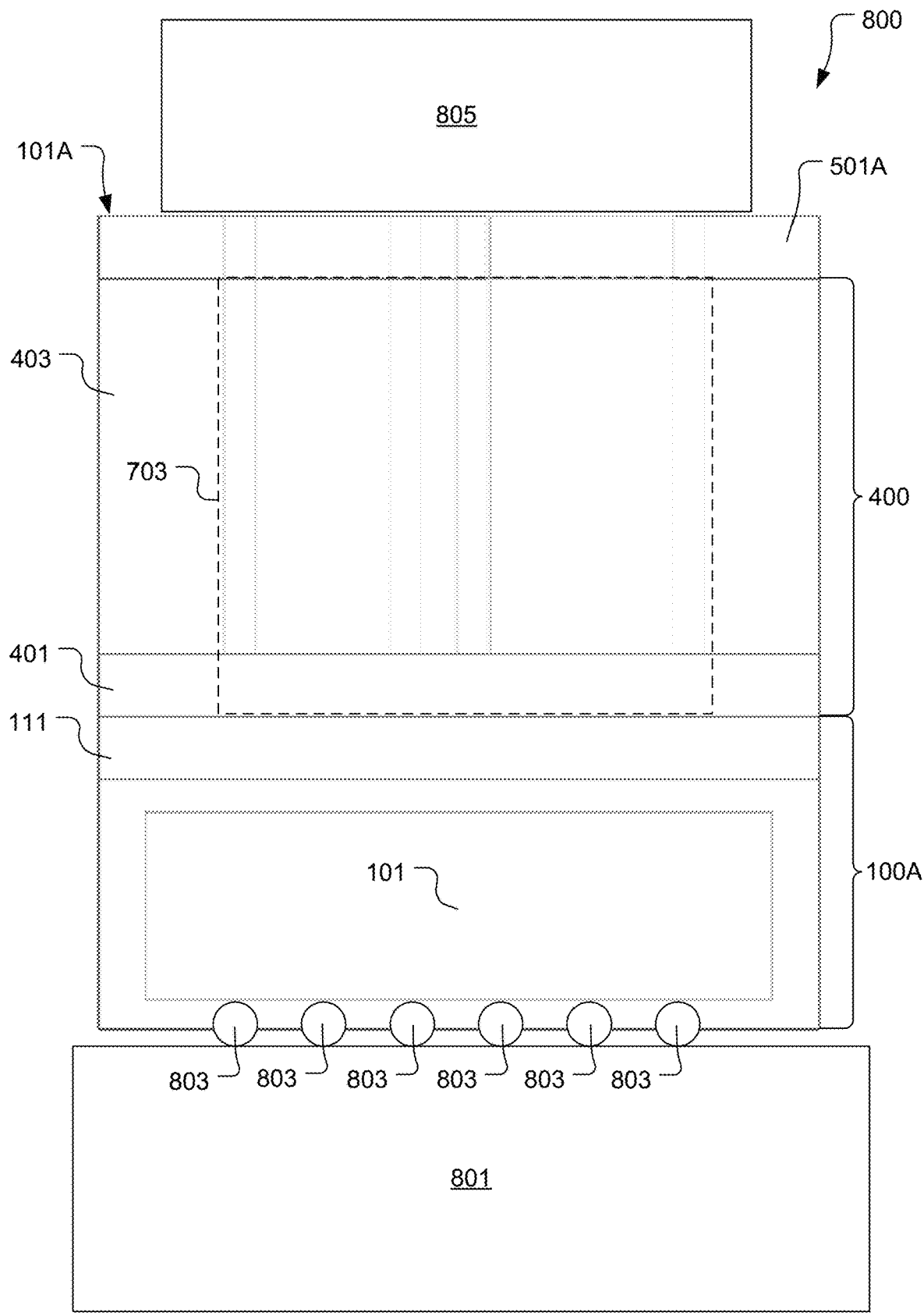
FIG. 8 shows a semiconductor package that includes the singulated die in connection with a substrate, in accordance with some embodiments.

FIG. 8 shows a semiconductor package 800 that includes the singulated die 101A in connection with a substrate 801, in accordance with some embodiments. In some embodiments, exposed electrical contacts of the singulated die 101A are electrically connected to corresponding exposed electrical contacts of the substrate 801 by a flip-chip connection. The example of FIG. 8 shows use of solder balls 803 to form the flip-chip connection between the singulated die 101A and the substrate 801. However, it should be understood that essentially type of flip-chip bonding technique can be used to connect the singulated die 101A to the substrate 801. The example of FIG. 8 shows the one singulated die 101A connected to the substrate 801 of the package 800 to form a single die module. However, it should be understood that in other embodiments multiple singulated die 101A can be connected to the same substrate 801 to form a multi-chip module (MCM). In various embodiments, the substrate 801 can be an organic substrate, a glass substrate, a ceramic substrate, or a combination thereof. Also, in some embodiments, the singulated die 101A is connected to the substrate 801 to form the semiconductor package 800 before etching of the replacement handle structure 400 through the openings in the hardmask material 501. Because the pattern 601 within the hardmask material 501 is already aligned as-needed with particular features within the singulated die 101A, no further masking is required to etch the cavities 703 corresponding to the pattern 601 into the replacement handle structure 400 at the semiconductor package level.

In some embodiments, the cavities 703 corresponding to the pattern 601 that are etched into the replacement handle structure 400 are configured to form features, slots, and/or structures to facilitate placement of one or more photonic components 805 on the singulated die 101A. For example, in some embodiments, the pattern 601 is configured to form slots within the replacement handle structure 400 that will provide for passive alignment of optical fibers and expose optical grating couplers on the singulated die 101A. In some embodiments, the pattern 601 is configured to form 12 slots with a pitch (slot centerline-to-slot centerline) of about 250 micrometers, and with a slot width of about 125 micrometers per slot. In these embodiments, the pattern 601 is positioned coincident with one or more optical grating couplers formed in the singulated die 101A. In some embodiments, the etch process that forms the cavities corresponding to the pattern 601 within the replacement handle structure 400 stops on a silicon nitride layer. In some embodiments, the substrate 801 supports multiple die to form an MCM, with at least one die of the multiple die having cavities corresponding to the pattern 601 formed within the hardmask material 501, and where other die of the multiple die may or may not have a respective patterned/unpatterned hardmask material 501.

Figure 9A:
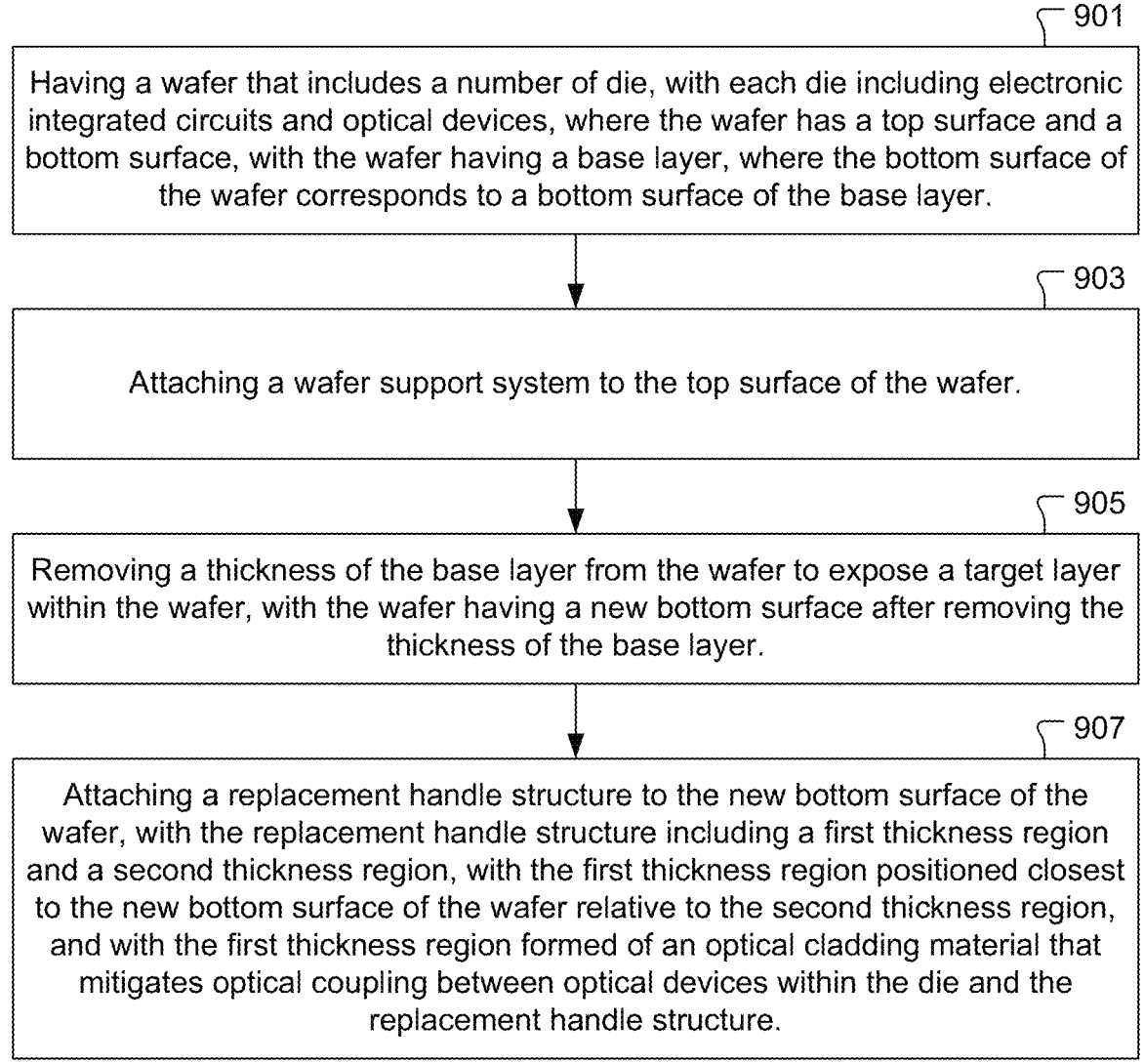
FIG. 9A shows a flowchart of a method for wafer-level handle replacement, in accordance with some embodiments.

FIG. 9A shows a flowchart of a method for wafer-level handle replacement, in accordance with some embodiments. The method includes an operation 901 for having a wafer (100) that includes a number of die (101). Each die (101) includes electronic integrated circuits and optical devices. The wafer (100) has a top surface (103) and a bottom surface (105). The wafer (100) have a base layer (107). The bottom surface (105) of the wafer (100) corresponds to a bottom surface (105) of the base layer (107). In some embodiments, the base layer (107) is formed of silicon. The method includes an operation 903 for attaching a wafer support system (200) to the top surface (103) of the wafer (100). In some embodiments, attaching the wafer support system (200) to the top surface (103) of the wafer (100) includes depositing an adhesive (201) between the top surface (103) of the wafer (100) and the wafer support system (200). The method includes an operation 905 for removing a thickness of the base layer (107) from the wafer (100) to expose a target layer within the wafer (100). The wafer has a new bottom surface (301) after removing the thickness of the base layer (107). In some embodiments, removing the thickness of the base layer (107) from the wafer (100) includes mechanical removal of a first portion of the base layer (107) followed by etching of second portion of the base layer (107) to expose the target layer within the wafer (100). In some embodiments, the target layer includes a buried oxide (BOX) region or a shallow trench isolation (STI) region.

The method also includes an operation 907 for attaching a replacement handle structure (400) to the new bottom surface (301) of the wafer (100). The replacement handle structure (400) including a first thickness region (401) and a second thickness region (403). The first thickness region (401) is positioned closest to the new bottom surface (301) of the wafer (100) relative to the second thickness region (403). The first thickness region (401) is formed of an optical cladding material that mitigates optical coupling between optical devices within the die (101) and the replacement handle structure (400). In some embodiments, the replacement handle structure (400) includes a silicon substrate or a glass substrate having a diameter that is substantially equal to a diameter of the wafer (100). In some embodiments, the replacement handle structure (400) has a thickness of about 125 micrometers as measured in a direction substantially perpendicular to the new bottom surface (301) of the wafer (100). In some embodiments, attaching the replacement handle structure (400) to the new bottom surface (301) of the wafer (100) includes fusion bonding of the replacement handle structure (400) to the new bottom surface (301) of the wafer (100). And, in some of these embodiments, the target layer corresponds to a BOX region and an exposed portion the first thickness region (401) of the replacement handle structure (400) is formed of silicon dioxide. In some embodiments, attaching the replacement handle structure (400) to the new bottom surface (301) of the wafer (100) includes depositing an adhesive between the replacement handle structure (400) and the new bottom surface (301) of the wafer (100). In some embodiments, the adhesive prevents optical coupling between the wafer (100) and the replacement handle structure (400). In some embodiments, the adhesive has a thickness greater than or equal to about 1 micrometer as measured in a direction substantially perpendicular to the new bottom surface (301) of the wafer (100). In some embodiments, attaching the replacement handle structure (400) to the new bottom surface (301) of the wafer (100) includes anodic bonding of the replacement handle structure (400) to the new bottom surface (301) of the wafer (100).

In some embodiments, the optical cladding material of first thickness region (401) of the replacement handle structure (400) is a film of dielectric material. In some embodiments, the film of dielectric material is one or more of silicon dioxide, silicon nitride, benzocyclobutene (BCB), polymethyl methacrylate (PMMA), polyimide, and/or a polymer material. In some embodiments, the target layer corresponds a buried oxide (BOX) region, and a combined thickness of the BOX region and the film of dielectric material is greater than or equal to about 1 micrometer as measured in a direction substantially perpendicular to the new bottom surface (301) of the wafer (100). In some embodiments, the film of dielectric material includes a stack of a first layer of silicon dioxide, a layer of silicon nitride, and a second layer of silicon dioxide, where the first layer of silicon dioxide is positioned closest to the new bottom surface (301) of the wafer (100) relative to the second layer of silicon dioxide, and the layer of silicon nitride positioned between the first and second layers of silicon dioxide. In some embodiments, the first layer of silicon dioxide has a thickness of about 0.1 nanometer as measured in a reference direction substantially perpendicular to the new bottom surface (301) of the wafer (100), and the layer of silicon nitride has a thickness of about 100 nanometers as measured in the reference direction, and the second layer of silicon dioxide has a thickness of about 1 micrometer as measured in the reference direction.

In some embodiments, each die (101) includes at least one optical grating coupler optically exposed to the replacement handle structure (400). In some embodiments, each die (101) includes at least one electrical contact exposed at the top surface of the wafer (100). In some embodiments, the wafer support system (200) includes a silicon substrate or a glass substrate having a diameter that is substantially equal to a diameter of the wafer (100).

Figure 9B:
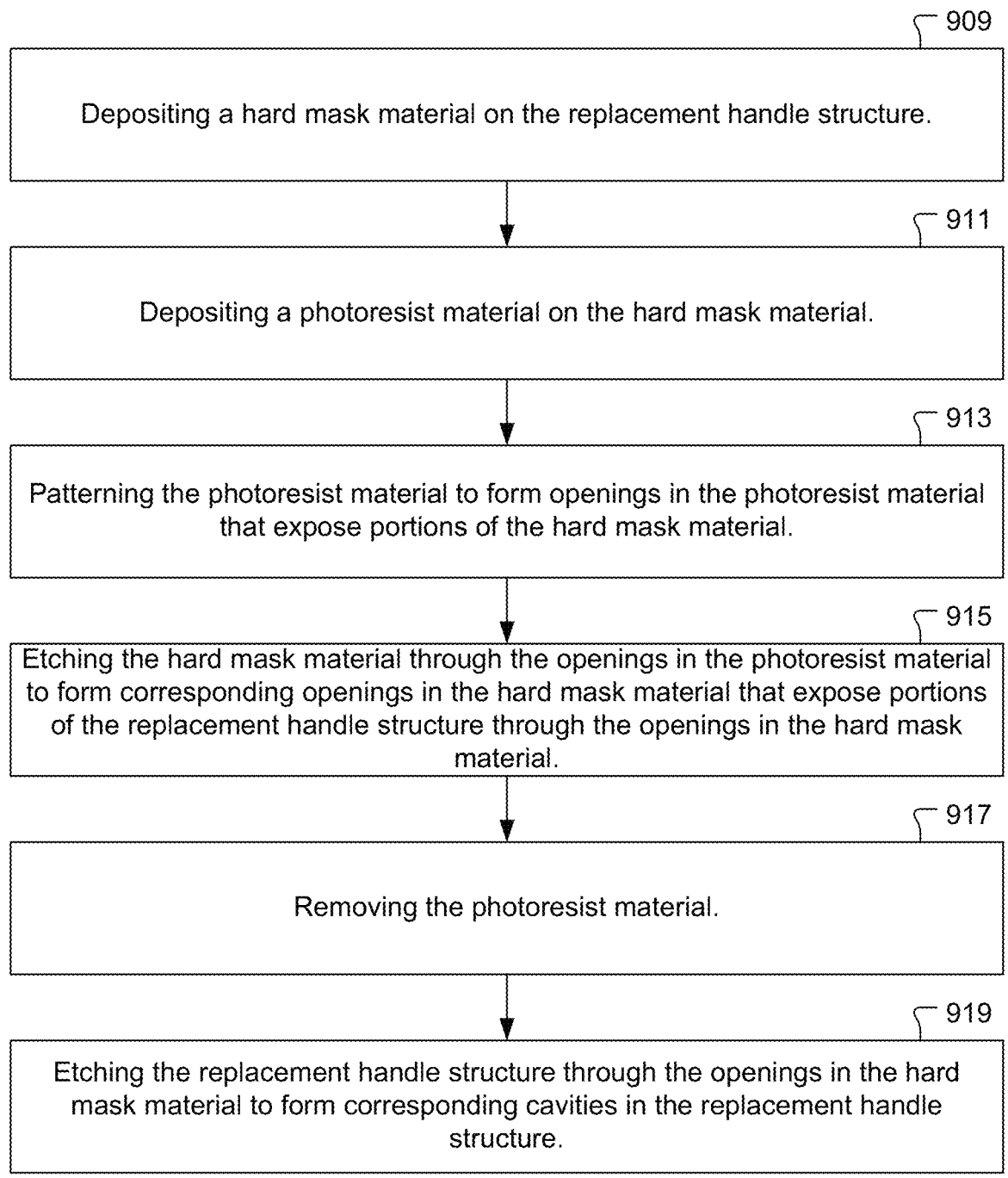
FIG. 9B shows a flowchart of a method for processing the replacement handle structure, in accordance with some embodiments.

FIG. 9B shows a flowchart of a method for processing the replacement handle structure (400), in accordance with some embodiments. The method of FIG. 9B is performed after the method of FIG. 9A. The method includes an operation 909 for depositing a hard mask material (501) on the replacement handle structure (400). The method also includes an operation 911 for depositing a photoresist material (503) on the hard mask material (501). The method also includes an operation 913 for patterning the photoresist material (503) to form openings in the photoresist material (503) that expose portions of the hard mask material (501). The method also includes an operation 915 for etching the hard mask material (501) through the openings in the photoresist material (503) to form corresponding openings in the hard mask material (501) that expose portions of the replacement handle structure (400) through the openings in the hard mask material (501). The method also includes an operation 917 for removing the photoresist material (503). The method also includes an operation 919 for etching the replacement handle structure (400) through the openings in the hard mask material (501) to form corresponding cavities (703) in the replacement handle structure (400).

In some embodiments, the replacement handle structure (400) is etched through the openings in the hard mask material (501) until the cavities (703) reach a specified level within the replacement handle structure (400) or die (101). In some embodiments, the specified level within the replacement handle structure (400) corresponds to a silicon layer or a silicon nitride layer. In some embodiments, the method includes allowing a native silicon dioxide layer to form on exposed surfaces of a silicon layer within the cavities (703), where the specified level within the replacement handle structure (400) corresponds to the silicon layer within the cavities (703). In some embodiments, the native silicon dioxide layer has a thickness of less than or equal to about 0.1 nanometer as measured in a direction substantially perpendicular to the new bottom surface (301) of the wafer (100). In some embodiments, a ratio of a thickness of the replacement handle structure (400) as measured in a reference direction substantially perpendicular to the new bottom surface (301) of the wafer (100) to a thickness of the native silicon dioxide layer as measured in the reference direction is greater than or equal to about 10.

In some embodiments, etching of the replacement handle structure (400) through the openings in the hard mask material (501) is done prior to singulation of the wafer (100). In some embodiments, etching of the replacement handle structure (400) through the openings in the hard mask material (501) is done after to singulation of the wafer (100). In some embodiments, the cavities (703) in the replacement handle structure (400) form optical waveguides. In some embodiments, the cavities (703) are positioned over the die (101) in the wafer (100) to enable optical connection of optical devices within the die (101) to respective optical devices external to the die (101). In some embodiments, the optical devices within the die (101) include at least one optical grating coupler. In some embodiments, at least some of the cavities (703) in the replacement handle structure (400) are formed to receive a photonic component. In some embodiments, at least some of the cavities (703) in the replacement handle structure (400) are formed to provide for passive alignment of optical fibers.

In some embodiments, the method of FIG. 9B includes singulating the wafer (100) along dicing channels before etching of the replacement handle structure (400) through the openings in the hard mask material (501). Singulating the wafer (100) results in physically separated die (101A) with each die (101A) having an attached respective portion of the replacement handle structure (400), and with the attached respective portion of the replacement handle structure (400) having thereon a corresponding portion of the hard mask material (501) with the openings formed in the corresponding portion of the hard mask material (501). In some embodiments, the method includes removing the wafer support system (200) from the top surface (103) of the wafer (100) before singulating the wafer (100). In some embodiments, singulating the wafer (100) is performed with the wafer support system (200) attached to the top surface (103) of the wafer (100), such that singulating the wafer (100) results in each die (101A) having an attached respective portion of the wafer support system (200).

In some embodiments, the method of FIG. 9B includes removing the wafer support system (200) from the top surface (103) of the wafer (100) after removing the photoresist material (503) and before etching of the replacement handle structure (400) through the openings in the hard mask material (501). In these embodiments, the method also includes singulating the wafer (100) along dicing channels after removing the wafer support system (200) and before etching of the replacement handle structure (400) through the openings in the hard mask material (501), where singulating the wafer (100) results in physically separated die (101A) with each die (101A) having an attached respective portion of the replacement handle structure (400), and with the attached respective portion of the replacement handle structure (400) having thereon a corresponding portion of the hard mask material (501) with the openings formed in the corresponding portion of the hard mask material (501). In these embodiments, the method also includes flip-chip bonding of a given die (101A) to a substrate (801) after singulating the wafer (100) and before etching of the replacement handle structure (400) through the openings in the hard mask material (501) corresponding to the given die (101A).

In some embodiments, the method of FIG. 9B includes singulating the wafer (100) along dicing channels after removing the photoresist material (503) and before etching of the replacement handle structure (400) through the openings in the hard mask material (501), where singulating the wafer (100) results in physically separated die (101A) with each die (101A) having an attached respective portion of the replacement handle structure (400), and with the attached respective portion of the replacement handle structure (400) having thereon a corresponding portion of the hard mask material (501) with the openings formed in the corresponding portion of the hard mask material (501). In these embodiments, the method also includes removing the wafer support system (200) from the top surface (103) of the wafer (100) after singulating the wafer (100) and before etching of the replacement handle structure (400) through the openings in the hard mask material (501). In these embodiments, the method also includes flip-chip bonding of a given die (101A) to a substrate (801) after singulating the wafer (100) and before etching of the replacement handle structure (400) through the openings in the hard mask material (501) corresponding to the given die (101A).

It should be understood that the methods disclosed herein provide for formation of an electro-optic chip assembly. The electro-optic chip assembly includes a die 101A having a top surface and a bottom surface. The top surface of the die 101A has a number of exposed electrical contacts. The bottom surface of the die 101A corresponds to a target layer within an original wafer 100 in which the die 101A was formed, where the target layer is exposed by removal of a portion of the original wafer 100. In some embodiments, the target layer includes a BOX region or an STI region. The die 101A includes electronic integrated circuits and optical devices. The electro-optic chip assembly also includes a replacement handle structure 400 attached to the bottom surface of the die 101A. The replacement handle structure 400 includes a first thickness region 401 and a second thickness region 403. The first thickness region 401 is positioned closest to the die 101A relative to the second thickness region 403. The first thickness region 401 is formed of an optical cladding material that mitigates optical coupling between optical devices within the die 101A and the replacement handle structure 400. The electro-optic chip assembly also includes a hard mask material 501 disposed on the replacement handle structure 400. The electro-optic chip assembly also includes a number of cavities 703 formed through the hard mask material 501 and the replacement handle structure 400 to a specified level. In some embodiments, the electro-optic chip assembly includes a substrate 801 having a number of exposed electrical contacts, where the die 101A is flip-chip bonded to the substrate 801 such that the number of exposed electrical contacts on the top surface of the die 101A are electrically connected to the number of exposed electrical contacts of the substrate 801.

In some embodiments, the die 101A includes at least one optical grating coupler optically exposed to the replacement handle structure 400. In some embodiments, the replacement handle structure 400 is formed of silicon or glass. In some embodiments, the optical cladding material is a film of dielectric material. In some embodiments, the film of dielectric material is one or more of silicon dioxide, silicon nitride, BCB, PMMA, polyimide, and/or a polymer material. In some embodiments, the target layer corresponds a BOX region, and a combined thickness of the BOX region and the film of dielectric material is greater than or equal to about 1 micrometer as measured in a direction substantially perpendicular to the bottom surface of the die (101A). In some embodiments, the film of dielectric material includes a stack of a first layer of silicon dioxide, a layer of silicon nitride, and a second layer of silicon dioxide, where the first layer of silicon dioxide is positioned closest to the die 101A relative to the second layer of silicon dioxide, and where the layer of silicon nitride is positioned between the first and second layers of silicon dioxide. In some embodiments, the first layer of silicon dioxide has a thickness of about 0.1 nanometer as measured in a reference direction substantially perpendicular to the bottom surface of the die 101A, and the layer of silicon nitride has a thickness of about 100 nanometers as measured in the reference direction, and the second layer of silicon dioxide has a thickness of about 1 micrometer as measured in the reference direction.

In some embodiments, the replacement handle structure 400 has a thickness of about 125 micrometers as measured in a direction substantially perpendicular to the bottom surface of the die 101A. In some embodiments, the replacement handle structure 400 is fusion bonded to the bottom surface of the die 101A. In some of these embodiments, the target layer corresponds to a BOX region, and a portion the first thickness region 401 of the replacement handle structure 400 adjacent to the die 101A is formed of silicon dioxide. In some embodiments, the replacement handle structure 400 is attached to the bottom surface of the die 101A by an adhesive. In some embodiments, the adhesive prevents optical coupling between the die 101A and the replacement handle structure 400. In some embodiments, the adhesive has a thickness greater than or equal to about 1 micrometer as measured in a direction substantially perpendicular to the bottom surface of the die 101A. In some embodiments, the replacement handle structure 400 is anodic bonded to the bottom surface of the die 101A.

In some embodiments, the cavities 703 in the replacement handle structure 400 form optical waveguides. In some embodiments, the cavities 703 are positioned over the die 101A to enable optical connection of optical devices within the die 101A to respective optical devices external to the die 101A. In some embodiments, the optical devices within the die 101A include at least one optical grating coupler. In some embodiments, at least some of the cavities 703 in the replacement handle structure 400 are formed to receive a photonic component. In some embodiments, at least some of the cavities in the replacement handle structure 400 are formed to provide for passive alignment of optical fibers. In some embodiments, the specified level to which the number of cavities 703 are formed within the replacement handle structure 400 corresponds to a silicon layer or a silicon nitride layer. In some embodiments, a native silicon dioxide layer exists on exposed surfaces of a silicon layer within the cavities 703, where the specified level to which the number of cavities 703 are formed within the replacement handle structure 400 corresponds to the silicon layer within the cavities 703. In some embodiments, the native silicon dioxide layer has a thickness of less than or equal to about 0.1 nanometer as measured in a direction substantially perpendicular to the bottom surface of the die 101A. In some embodiments, a ratio of a thickness of the replacement handle structure 400 as measured in a reference direction substantially perpendicular to the bottom surface of the die 101A to a thickness of the native silicon dioxide layer as measured in the reference direction is greater than or equal to about 10.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the invention description. Accordingly, the present embodiments are to be considered as illustrative and not restrictive, and the invention is not to be limited to the details given herein, but may be modified within the scope and equivalents of the described embodiments.

What is claimed is:

1. A method for wafer-level handle replacement, comprising:
    having a wafer that includes a number of die, each die including electronic integrated circuits and optical devices, the wafer having a top surface and a bottom surface, the wafer having a base layer, the bottom surface of the wafer corresponding to a bottom surface of the base layer;
    attaching a wafer support system to the top surface of the wafer;
    removing a thickness of the base layer from the wafer to expose a target layer within the wafer, the wafer having a new bottom surface after removing the thickness of the base layer;
    having a replacement handle structure that includes a first thickness region and a second thickness region structurally integrated together so that the replacement handle structure is a monolithic solid structure that includes the first thickness region and the second thickness region; and
    attaching the replacement handle structure to the new bottom surface of the wafer, the first thickness region of the replacement handle structure positioned between the new bottom surface of the wafer and the second thickness region of the replacement handle structure, the first thickness region including an optical cladding material that mitigates optical coupling between optical devices within the die and the replacement handle structure.

2. The method as recited in claim 1, wherein the base layer is formed of silicon.

3. The method as recited in claim 1, wherein each die includes at least one optical grating coupler optically exposed to the replacement handle structure.

4. The method as recited in claim 1, wherein each die includes at least one electrical contact exposed at the top surface of the wafer.

5. The method as recited in claim 1, wherein the wafer support system includes a silicon substrate or a glass substrate having a diameter that is substantially equal to a diameter of the wafer.

6. The method as recited in claim 1, wherein attaching the wafer support system to the top surface of the wafer includes depositing an adhesive between the top surface of the wafer and the wafer support system.

7. The method as recited in claim 1, wherein removing the thickness of the base layer from the wafer includes mechanical removal of a first portion of the base layer followed by etching of second portion of the base layer to expose the target layer within the wafer.

8. The method as recited in claim 1, wherein the target layer includes a buried oxide (BOX) region or a shallow trench isolation (STI) region.

9. The method as recited in claim 1, wherein the replacement handle structure includes a silicon substrate or a glass substrate having a diameter that is substantially equal to a diameter of the wafer.

10. The method as recited in claim 1, wherein the optical cladding material is a film of dielectric material.

11. The method as recited in claim 10, wherein the film of dielectric material is one or more of silicon dioxide, silicon nitride, benzocyclobutene (BCB), polymethyl methacrylate (PMMA), polyimide, and/or a polymer material.

12. The method as recited in claim 10, wherein the target layer corresponds a buried oxide (BOX) region, and wherein a combined thickness of the BOX region and the film of dielectric material is greater than or equal to about 1 micrometer as measured in a direction substantially perpendicular to the new bottom surface of the wafer.

13. The method as recited in claim 1, wherein the replacement handle structure has a thickness of about 125 micrometers as measured in a direction substantially perpendicular to the new bottom surface of the wafer.

14. The method as recited in claim 1, wherein attaching the replacement handle structure to the new bottom surface of the wafer includes fusion bonding of the replacement handle structure to the new bottom surface of the wafer.

15. The method as recited in claim 14, wherein the target layer corresponds to a buried oxide (BOX) region and an exposed portion the first thickness region of the replacement handle structure is formed of silicon dioxide.

16. The method as recited in claim 1, wherein attaching the replacement handle structure to the new bottom surface of the wafer includes depositing an adhesive between the replacement handle structure and the new bottom surface of the wafer.

17. The method as recited in claim 16, wherein the adhesive prevents optical coupling between the wafer and the replacement handle structure.

18. The method as recited in claim 16, wherein the adhesive has a thickness greater than or equal to about 1 micrometer as measured in a direction substantially perpendicular to the new bottom surface of the wafer.

19. The method as recited in claim 1, wherein attaching the replacement handle structure to the new bottom surface of the wafer includes anodic bonding of the replacement handle structure to the new bottom surface of the wafer.

20. A method for wafer-level handle replacement, comprising:
having a wafer that includes a number of die, each die including electronic integrated circuits and optical devices, the wafer having a top surface and a bottom surface, the wafer having a base layer, the bottom surface of the wafer corresponding to a bottom surface of the base layer;
attaching a wafer support system to the top surface of the wafer;
removing a thickness of the base layer from the wafer to expose a target layer within the wafer, the wafer having a new bottom surface after removing the thickness of the base layer; and
attaching a replacement handle structure to the new bottom surface of the wafer, the replacement handle structure including a first thickness region and a second thickness region, the first thickness region positioned closest to the new bottom surface of the wafer relative to the second thickness region, the first thickness region including an optical cladding material that mitigates optical coupling between optical devices within the die and the replacement handle structure, wherein the optical cladding material is a film of dielectric material that includes a stack of a first layer of silicon dioxide, a layer of silicon nitride, and a second layer of silicon dioxide, the first layer of silicon dioxide positioned closest to the new bottom surface of the wafer relative to the second layer of silicon dioxide, and the layer of silicon nitride positioned between the first and second layers of silicon dioxide.

21. The method as recited in claim 20, wherein the first layer of silicon dioxide has a thickness of about 0.1 nanometer as measured in a reference direction substantially perpendicular to the new bottom surface of the wafer, the layer of silicon nitride has a thickness of about 100 nanometers as measured in the reference direction, and the second layer of silicon dioxide has a thickness of about 1 micrometer as measured in the reference direction.

22. A method for wafer-level handle replacement, comprising:
having a wafer that includes a number of die, each die including electronic integrated circuits and optical devices, the wafer having a top surface and a bottom surface, the wafer having a base layer, the bottom surface of the wafer corresponding to a bottom surface of the base layer;
attaching a wafer support system to the top surface of the wafer;
removing a thickness of the base layer from the wafer to expose a target layer within the wafer, the wafer having a new bottom surface after removing the thickness of the base layer; and
attaching a replacement handle structure to the new bottom surface of the wafer, the replacement handle structure including a first thickness region and a second thickness region, the first thickness region positioned closest to the new bottom surface of the wafer relative to the second thickness region, the first thickness region including an optical cladding material that mitigates optical coupling between optical devices within the die and the replacement handle structure;
depositing a hard mask material on the replacement handle structure;

depositing a photoresist material on the hard mask material;

patterning the photoresist material to form openings in the photoresist material that expose portions of the hard mask material;

etching the hard mask material through the openings in the photoresist material to form corresponding openings in the hard mask material that expose portions of the replacement handle structure through the openings in the hard mask material;

removing the photoresist material; and etching the replacement handle structure through the openings in the hard mask material to form corresponding cavities in the replacement handle structure.

23. The method as recited in claim 22, wherein the cavities in the replacement handle structure form optical waveguides.

24. The method as recited in claim 22, wherein the cavities are positioned over the die in the wafer to enable optical connection of optical devices within the die to respective optical devices external to the die.

25. The method as recited in claim 24, wherein the optical devices within the die include at least one optical grating coupler.

26. The method as recited in claim 22, wherein at least some of the cavities in the replacement handle structure are formed to receive a photonic component.

27. The method as recited in claim 22, wherein at least some of the cavities in the replacement handle structure are formed to provide for passive alignment of optical fibers.

28. The method as recited in claim 22, wherein etching of the replacement handle structure through the openings in the hard mask material is done prior to singulation of the wafer.

29. The method as recited in claim 22, further comprising:
singulating the wafer along dicing channels before etching of the replacement handle structure through the openings in the hard mask material, wherein singulating the wafer results in physically separated die with each die having an attached respective portion of the replacement handle structure, and with the attached respective portion of the replacement handle structure having thereon a corresponding portion of the hard mask material with the openings formed in the corresponding portion of the hard mask material.

30. The method as recited in claim 29, further comprising:
removing the wafer support system from the top surface of the wafer before singulating the wafer.

31. The method as recited in claim 29, wherein singulating the wafer is performed with the wafer support system attached to the top surface of the wafer, wherein singulating the wafer results in each die having an attached respective portion of the wafer support system.

32. The method as recited in claim 22, wherein the replacement handle structure is etched through the openings in the hard mask material until the cavities reach a specified level within the replacement handle structure.

33. The method as recited in claim 32, wherein the specified level within the replacement handle structure corresponds to a silicon layer or a silicon nitride layer.

34. The method as recited in claim 32, further comprising:
allowing a native silicon dioxide layer to form on exposed surfaces of a silicon layer within the cavities, wherein the specified level within the replacement handle structure corresponds to the silicon layer within the cavities.

35. The method as recited in claim 34, wherein the native silicon dioxide layer has a thickness of less than or equal to about 0.1 nanometer as measured in a direction substantially perpendicular to the new bottom surface of the wafer.

36. The method as recited in claim 34, wherein a ratio of a thickness of the replacement handle structure as measured in a reference direction substantially perpendicular to the new bottom surface of the wafer to a thickness of the native silicon dioxide layer as measured in the reference direction is greater than or equal to about 10.

37. The method as recited in claim 22, further comprising:
removing the wafer support system from the top surface of the wafer after removing the photoresist material and before etching of the replacement handle structure through the openings in the hard mask material;

singulating the wafer along dicing channels after removing the wafer support system and before etching of the replacement handle structure through the openings in the hard mask material, wherein singulating the wafer results in physically separated die with each die having an attached respective portion of the replacement handle structure, and with the attached respective portion of the replacement handle structure having thereon a corresponding portion of the hard mask material with the openings formed in the corresponding portion of the hard mask material; and flip-chip bonding of a given die to a substrate after singulating the wafer and before etching of the replacement handle structure through the openings in the hard mask material corresponding to the given die.

38. The method as recited in claim 22, further comprising:
singulating the wafer along dicing channels after removing the photoresist material and before etching of the replacement handle structure through the openings in the hard mask material, wherein singulating the wafer results in physically separated die with each die having an attached respective portion of the replacement handle structure, and with the attached respective portion of the replacement handle structure having thereon a corresponding portion of the hard mask material with the openings formed in the corresponding portion of the hard mask material;

removing the wafer support system from the top surface of the wafer after singulating the wafer and before etching of the replacement handle structure through the openings in the hard mask material; and flip-chip bonding of a given die to a substrate after singulating the wafer and before etching of the replacement handle structure through the openings in the hard mask material corresponding to the given die.

* * * * *